(12) United States Patent
Qiu

(10) Patent No.: US 11,928,885 B2
(45) Date of Patent: Mar. 12, 2024

(54) FINGERPRINT IDENTIFICATION METHOD, FINGERPRINT IDENTIFICATION APPARATUS AND ELECTRONIC DEVICE

(71) Applicant: SHENZHEN GOODIX TECHNOLOGY CO., LTD., Shenzhen (CN)

(72) Inventor: Fangfang Qiu, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 289 days.

(21) Appl. No.: 17/362,634

(22) Filed: Jun. 29, 2021

(65) Prior Publication Data

US 2021/0326561 A1    Oct. 21, 2021

Related U.S. Application Data

(63) Continuation of application No. PCT/CN2020/083845, filed on Apr. 8, 2020.

(51) Int. Cl.
*G06V 40/13*    (2022.01)
*H01L 27/146*   (2006.01)
*H10K 59/65*    (2023.01)

(52) U.S. Cl.
CPC .... *G06V 40/1318* (2022.01); *H01L 27/14621* (2013.01); *H01L 27/14623* (2013.01); *H01L 27/14627* (2013.01); *H01L 27/14678* (2013.01); *H10K 59/65* (2023.02)

(58) Field of Classification Search
CPC ................................................ H01L 27/14621
See application file for complete search history.

(56) References Cited

U.S. PATENT DOCUMENTS

| 10,279,853 | B2 | 5/2019 | Filion et al. |
| 10,331,939 | B2 | 6/2019 | He |
| 10,579,853 | B2 | 3/2020 | Zuo |
| 2009/0046903 | A1 | 2/2009 | Corcoran |

(Continued)

FOREIGN PATENT DOCUMENTS

| CN | 204515800 U | 7/2015 |
| CN | 107690653 A | 2/2018 |

(Continued)

*Primary Examiner* — Joseph R Haley

(57) ABSTRACT

Embodiments of the present application provide a fingerprint identification method, a fingerprint identification apparatus and an electronic device. The fingerprint identification method is applied to a fingerprint identification apparatus disposed under a display screen of an electronic device, the fingerprint identification apparatus includes a pixel array and a colour filter layer, the colour filter layer includes at least one filter unit, and the at least one filter unit is disposed above at least one first type pixel of the pixel array, respectively, and the method includes: capturing a first light signal transmitting through the at least one filter unit and sensed by the first type pixel; determining a fingerprint identification environment according to an intensity of the first light signal; and determining, based on the fingerprint identification environment, a target capturing parameter of capturing a fingerprint light signal, the fingerprint light signal being used for fingerprint identification.

16 Claims, 12 Drawing Sheets

(56) References Cited

U.S. PATENT DOCUMENTS

| | | |
|---|---|---|
| 2011/0043486 A1 | 2/2011 | Hagiwara |
| 2013/0119237 A1 | 5/2013 | Raguin |
| 2017/0085813 A1 | 3/2017 | Reinhold |
| 2018/0322322 A1 | 11/2018 | Zhou |
| 2019/0012512 A1 | 1/2019 | He |
| 2019/0057237 A1 | 2/2019 | Zuo et al. |
| 2019/0157337 A1 | 5/2019 | Lin et al. |
| 2019/0180072 A1 | 6/2019 | Fomani |
| 2019/0303639 A1 | 10/2019 | He |
| 2019/0362120 A1 | 11/2019 | Yeke Yazdandoost |
| 2020/0026900 A1* | 1/2020 | Zhou .................. G06V 10/141 |
| 2020/0034596 A1 | 1/2020 | He |
| 2020/0074134 A1 | 3/2020 | Lim et al. |
| 2020/0097696 A1 | 3/2020 | Yao |
| 2020/0193138 A1 | 6/2020 | Li |
| 2020/0293738 A1 | 9/2020 | Zhang |
| 2020/0293741 A1 | 9/2020 | Du |
| 2020/0401782 A1 | 12/2020 | Cheng |
| 2020/0410202 A1 | 12/2020 | Lin |
| 2021/0064842 A1 | 3/2021 | Östlund |
| 2021/0374379 A1* | 12/2021 | Nilsson ............ H01L 27/14621 |
| 2021/0383089 A1 | 12/2021 | Ye |

FOREIGN PATENT DOCUMENTS

| | | |
|---|---|---|
| CN | 107767835 A | 3/2018 |
| CN | 109313706 A | 2/2019 |
| CN | 109522697 A | 3/2019 |
| CN | 109934137 A | 6/2019 |
| CN | 109983471 A | 7/2019 |
| CN | 110088768 A | 8/2019 |
| CN | 110741381 A | 1/2020 |
| CN | 210091189 U | 2/2020 |
| CN | 210091193 U | 2/2020 |
| CN | 211554961 U | 9/2020 |
| CN | 213069853 U | 4/2021 |
| EP | 3620901 A1 | 3/2020 |
| EP | 3657381 A1 | 5/2020 |
| KR | 20140007518 A | 1/2014 |
| KR | 20180001904 A | 1/2018 |
| KR | 20180005588 A | 1/2018 |
| KR | 20190028939 A | 3/2019 |
| KR | 20190041349 A | 4/2019 |

* cited by examiner

FINGERPRINT IDENTIFICATION METHOD, FINGERPRINT IDENTIFICATION APPARATUS AND ELECTRONIC DEVICE

CROSS-REFERENCE TO RELATED APPLICATIONS

This application is a continuation of International Application No. PCT/CN2020/083845, filed on Apr. 8, 2020, the disclosure of which is hereby incorporated by reference in its entirety.

TECHNICAL FIELD

Embodiments of the present application relate to the technical field of fingerprint identification, and in particular, to a fingerprint identification method, a fingerprint identification apparatus and an electronic device.

BACKGROUND

With rapid development of a terminal industry, biometric identification technology has received more attention from people, and the application of under-screen biometric technology such as under-screen fingerprint identification technology has become more widespread. In the under-screen fingerprint identification technology, imaging is performed according to the difference of reflection abilities of a ridge and a valley of a fingerprint to light, so as to perform fingerprint identification.

Generally, the result of fingerprint identification will be affected by an external environment. Therefore, how to improve the accuracy of fingerprint identification under the change of the external environment is an urgent problem to be solved.

SUMMARY

Embodiments of the present application provide a fingerprint identification method, a fingerprint identification apparatus and an electronic device, which could effectively improve the accuracy of fingerprint identification.

In a first aspect, a fingerprint identification method is provided, where the method is applied to a fingerprint identification apparatus disposed under a display screen of an electronic device, the fingerprint identification apparatus includes a pixel array and a colour filter layer, the colour filter layer includes at least one filter unit, and the at least one filter unit is disposed above at least one first type pixel of the pixel array, respectively, and the method includes: capturing a first light signal transmitting through the at least one filter unit and sensed by the first type pixel; determining a fingerprint identification environment according to an intensity of the first light signal; and determining, based on the fingerprint identification environment, a target capturing parameter of capturing a fingerprint light signal returned by reflection or scattering of a finger above the display screen, the fingerprint light signal being used for fingerprint identification.

In a possible implementation manner, the at least one filter unit includes at least one red filter unit, the red filter unit is configured to transmit through a red light signal, and the first light signal includes the red light signal.

In a possible implementation manner, the determining the fingerprint identification environment according to the intensity of the first light signal includes: determining that the fingerprint identification environment is a strong light environment when an intensity of the red light signal is greater than a preset red light signal intensity; or determining that the fingerprint identification environment is a normal environment when an intensity of the red light signal is less than or equal to a preset red light signal intensity.

In a possible implementation manner, the at least one filter unit further includes at least one blue filter unit, the blue light signal is configured to transmit through a blue light signal, and the first light signal further includes the blue light signal.

In a possible implementation manner, the determining the fingerprint identification environment according to the intensity of the first light signal includes: determining that the fingerprint identification environment is a specific environment when an intensity of the red light signal is less than or equal to a preset red light signal intensity and an intensity of the blue light signal is greater than a preset blue light signal intensity.

In a possible implementation manner, the determining, based on the fingerprint identification environment, the target capturing parameter of capturing the fingerprint light signal returned by reflection or scattering of the finger above the display screen includes: determining an adjustment amount of a preset capturing parameter according to a variation of ambient light of the fingerprint identification environment relative to preset ambient light, where under the preset ambient light, a capturing parameter of capturing the fingerprint light signal is the preset capturing parameter; and determining the target capturing parameter according to the preset capturing parameter and the adjustment amount.

In a possible implementation manner, the target capturing parameter includes a target exposure time and a target gain parameter, and the preset capturing parameter includes a preset exposure time and a preset gain parameter; if the fingerprint identification environment is a strong light environment, a target product is a difference between a preset product and the adjustment amount, where the target product is a product of the target exposure time and the target gain parameter, and the preset product is a product of the preset exposure time and the preset gain parameter; if the fingerprint identification environment is a normal environment, the adjustment amount is zero and the target product is the preset product; and if the fingerprint identification environment is a specific environment, the target product is a sum of the preset product and the adjustment amount.

In a possible implementation manner, when the fingerprint identification environment is the strong light environment, the preset exposure time is increased to the target exposure time, and the preset gain parameter is decreased to the target gain parameter; or the target exposure time is the preset exposure time, and the preset gain parameter is decreased to the target gain parameter; or the preset exposure time is decreased to the target exposure time, and the preset gain parameter is decreased to the target gain parameter.

In a possible implementation manner, when the fingerprint identification environment is the normal environment, the target exposure time is the preset exposure time, and the target gain parameter is the preset gain parameter.

In a possible implementation manner, when the fingerprint identification environment is the specific environment, the preset exposure time is increased to the target exposure time, and the preset gain parameter is increased to the target gain parameter; or the target exposure time is the preset exposure time, and the preset gain parameter is increased to the target gain parameter; or the preset exposure time is decreased to the target exposure time, and the preset gain parameter is increased to the target gain parameter.

In a possible implementation manner, a blue light component in the specific environment is greater than twice as large as a blue light component in a normal environment.

In a possible implementation manner, the at least one filter unit is uniformly or non-uniformly distributed on the colour filter layer.

In a possible implementation manner, when the at least one filter unit is uniformly distributed on the colour filter layer, the at least one filter unit is arranged on the colour filter layer at an interval.

In a possible implementation manner, the at least one filter unit is distributed in an edge region of the colour filter layer.

In a possible implementation manner, the at least one filter unit is discretely distributed in the edge region of the colour filter layer.

In a second aspect, a fingerprint identification apparatus is provided, where the fingerprint identification apparatus is disposed under a display screen of an electronic device for under-screen fingerprint identification, and the fingerprint identification apparatus includes: a pixel array configured to capture a fingerprint light signal returned by reflection or scattering of a finger above the display screen, the fingerprint light signal being used for fingerprint identification; and a colour filter layer including at least one filter unit, the at least one filter unit being disposed above at least one first type pixel of the pixel array, respectively; where the at least one first type pixel is configured to sense a first light signal transmitting through the at least one filter unit, and an intensity of the first light signal is used for determining a fingerprint identification environment to obtain a target capturing parameter of capturing the fingerprint light signal.

In a possible implementation manner, the fingerprint identification apparatus further includes a processor, and the processor is configured to: determine the fingerprint identification environment based on the intensity of the first light signal; and determine the target capturing parameter based on the fingerprint identification environment.

In a possible implementation manner, a processor of the electronic device is configured to: determine the fingerprint identification environment based on the intensity of the first light signal; and determine the target capturing parameter based on the fingerprint identification environment.

In a possible implementation manner, the at least one filter unit includes at least one red filter unit, the red filter unit is configured to transmit through a red light signal, and the first light signal includes the red light signal.

In a possible implementation manner, the processor is configured to: determine that the fingerprint identification environment is a strong light environment when an intensity of the red light signal is greater than a preset red light signal intensity; or determine that the fingerprint identification environment is a normal environment when an intensity of the red light signal is less than or equal to a preset red light signal intensity.

In a possible implementation manner, the at least one filter unit further includes at least one blue filter unit, the blue light signal is configured to transmit through a blue light signal, and the first light signal further includes the blue light signal.

In a possible implementation manner, the processor is configured to: determine that the fingerprint identification environment is a specific environment when an intensity of the red light signal is less than or equal to a preset red light signal intensity and an intensity of the blue light signal is greater than a preset blue light signal intensity.

In a possible implementation manner, the processor is configured to: determine an adjustment amount of a preset capturing parameter according to a variation of ambient light of the fingerprint identification environment relative to preset ambient light, where under the preset ambient light, a capturing parameter of capturing the fingerprint light signal is the preset capturing parameter; and determine the target capturing parameter according to the preset capturing parameter and the adjustment amount.

In a possible implementation manner, the target capturing parameter includes a target exposure time and a target gain parameter, and the preset capturing parameter includes a preset exposure time and a preset gain parameter; if the fingerprint identification environment is a strong light environment, a target product is a difference between a preset product and the adjustment amount, where the target product is a product of the target exposure time and the target gain parameter, and the preset product is a product of the preset exposure time and the preset gain parameter; if the fingerprint identification environment is a normal environment, the adjustment amount is zero and the target product is the preset product; and if the fingerprint identification environment is a specific environment, the target product is a sum of the preset product and the adjustment amount.

In a possible implementation manner, when the fingerprint identification environment is the strong light environment, the processor is configured to: increase the preset exposure time to the target exposure time, and decrease the preset gain parameter to the target gain parameter; or not adjust the preset exposure time, and decrease the preset gain parameter to the target gain parameter; or decrease the preset exposure time to the target exposure time, and decrease the preset gain parameter to the target gain parameter.

In a possible implementation manner, when the fingerprint identification environment is the normal environment, the processor does not adjust the preset exposure time and the preset gain parameter.

In a possible implementation manner, when the fingerprint identification environment is the specific light environment, the processor is configured to: increase the preset exposure time to the target exposure time, and increase the preset gain parameter to the target gain parameter; or not adjust the preset exposure time, and increase the preset gain parameter to the target gain parameter; or decrease the preset exposure time to the target exposure time, and increase the preset gain parameter to the target gain parameter.

In a possible implementation manner, a blue light component in the specific environment is greater than twice as large as a blue light component in a normal environment.

In a possible implementation manner, the at least one filter unit is uniformly or non-uniformly distributed on the colour filter layer.

In a possible implementation manner, when the at least one filter unit is uniformly distributed on the colour filter layer, the at least one filter unit is arranged on the colour filter layer at an interval.

In a possible implementation manner, the at least one filter unit is distributed in an edge region of the colour filter layer.

In a possible implementation manner, the at least one filter unit is discretely distributed in the edge region of the colour filter layer.

In a possible implementation manner, the fingerprint identification apparatus further includes at least one light shielding layer and a micro-lens array, the at least one light shielding layer is located under the micro-lens array and is provided with a plurality of light passing apertures, and the pixel array is configured to receive a light signal converged to the plurality of light passing apertures via the micro-lens array and passing through the plurality of light passing apertures; where the colour filter layer is disposed between the at least one light shielding layer and the micro-lens array.

In a third aspect, an electronic device is provided, including a display screen, and the fingerprint identification apparatus according to the second aspect and any one of possible implementation manners of the second aspect.

According to the foregoing technical solution, the fingerprint identification apparatus includes a filter unit disposed above a pixel, and the filter unit may transmit through light signals in different colors, so that the pixel may sense the light signals in different colors, so as to determine a fingerprint identification environment based on the sensed light signals in different colors, thereby determining a capturing parameter for capturing a fingerprint light signal corresponding to the fingerprint identification environment, and thus the accuracy of fingerprint identification based on the capturing parameter is higher.

DESCRIPTION OF EMBODIMENTS

Technical solutions of the present application are described below in combination with accompanying drawings.

It should be understood that embodiments of the present application may be applied to a fingerprint system, including but not limited to an optical, ultrasonic or other fingerprint detection system and a medical diagnostic product based on optical, ultrasonic or other fingerprint imaging. The embodiments of the present application are only described by an example of an optical fingerprint system, which should not constitute any limitation to the embodiments of the present application, and the embodiments of the present application are also applicable to other systems using an optical, ultrasonic or other imaging technology or the like.

As a common application scenario, the optical fingerprint system provided in an embodiment of the present application may be applied to a smart phone, a tablet computer, and other mobile terminals having a display screen or other electronic devices. More specifically, in the foregoing electronic device, an optical fingerprint module may be disposed in a partial region or an entire region under a display screen, thereby forming an under-display (or Under-screen) optical fingerprint system. Alternatively, the optical fingerprint module may be partially or entirely integrated into the interior of the display screen of the electronic device to form an in-display optical fingerprint system.

The optical under-screen fingerprint detection technology uses light returned from a top surface of a display component of a device for fingerprint sensing and other sensing operations. The returned light carries information of an object such as a finger in contact with the top surface, and optical fingerprint detection of a particular optical sensor module located under a display screen is implemented by capturing and detecting the returned light by the finger. An optical sensor module may be designed to achieve desired optical imaging by properly configuring an optical element for capturing and detecting the returned light.

Figure 1A:
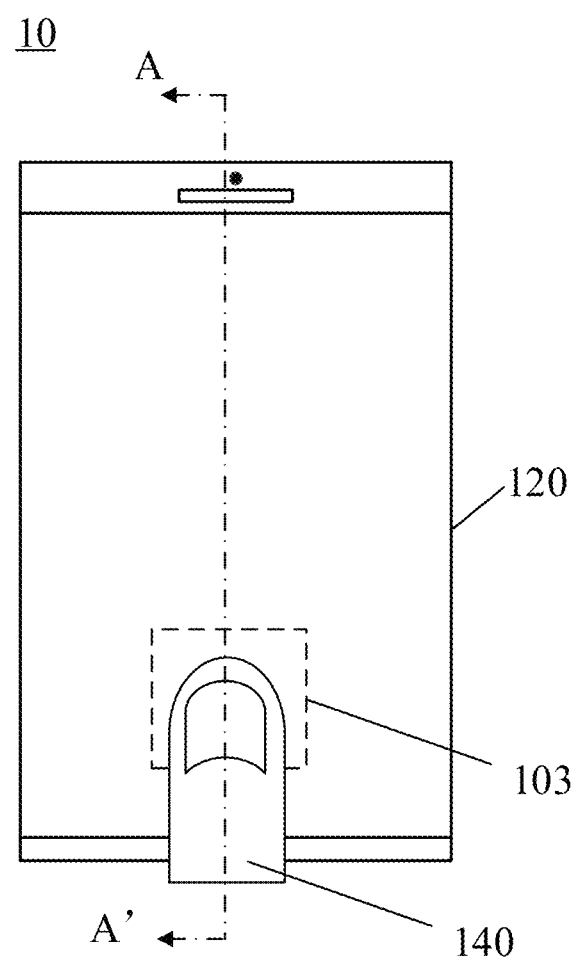
FIGS. 1A and 1B are schematic diagrams of an electronic device to which an embodiment of the present application is applicable.
Figure 1B:
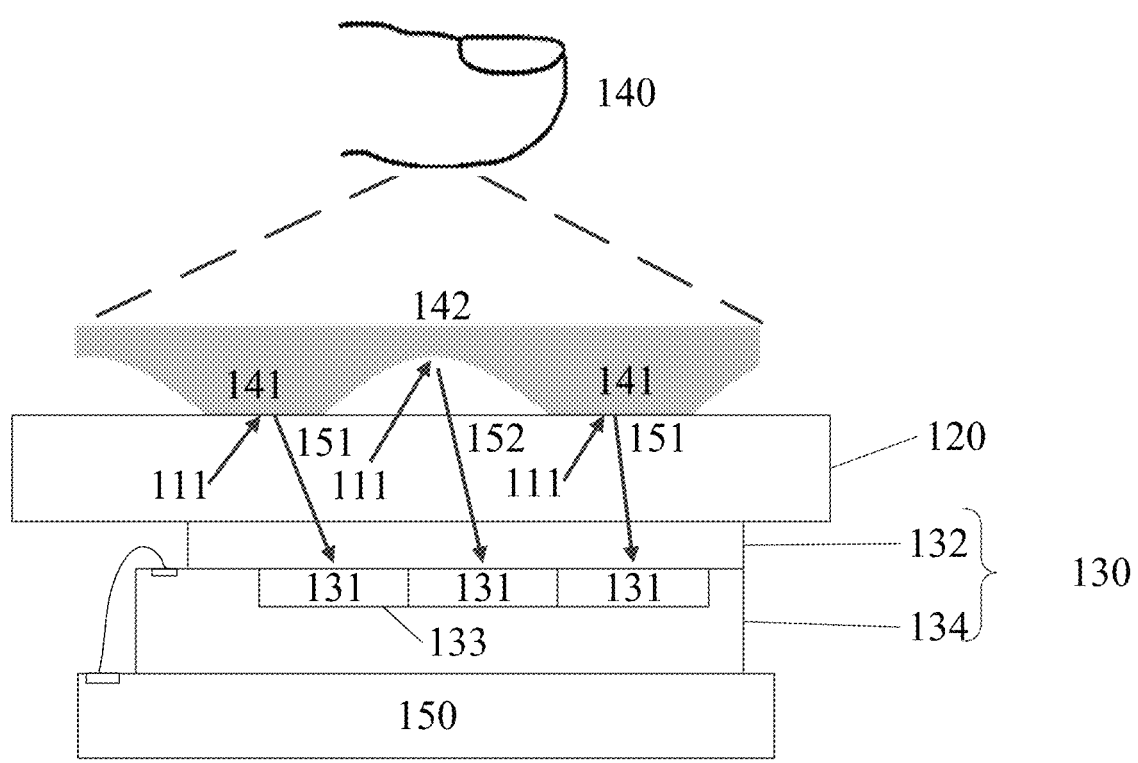
Figure 2A:
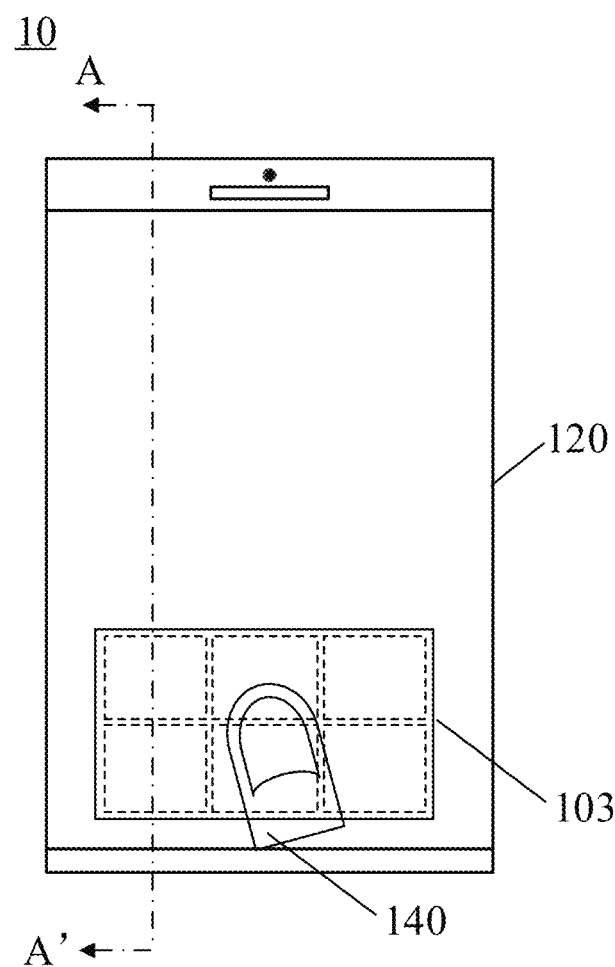
FIGS. 2A and 2B are schematic cross-sectional diagrams of the electronic device shown in FIGS. 1A and 1B taken along an A-A' direction, respectively.
Figure 2B:
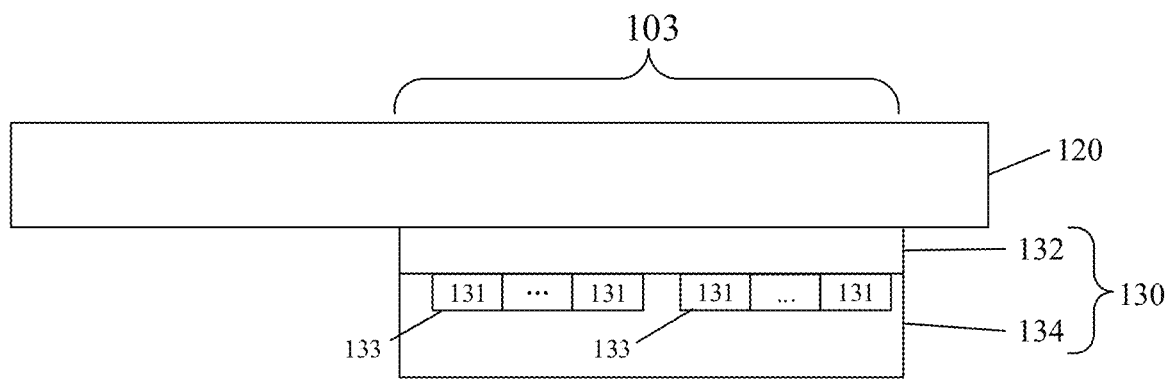

FIG. 1A and FIG. 2A shows schematic diagrams of an electronic device to which an embodiment of the present application is applicable. FIG. 1A and FIG. 2A are schematic oriented diagrams of an electronic device 10; and FIG. 1B and FIG. 2B are partial schematic cross-sectional diagrams of the electronic device 10 shown in FIG. 1A and FIG. 2A taken along an A-A' direction, respectively.

The electronic device 10 includes a display screen 120 and a fingerprint identification apparatus 130. The fingerprint identification apparatus 130 is disposed in a partial region under the display screen 120. The fingerprint identification apparatus 130 includes an optical fingerprint sensor that includes a sensing array 133 having a plurality of optical sensing units 131 (which may also be referred to as pixels, photosensitive pixels, pixel units, etc.). A region where the sensing array 133 is located or a sensing region of the sensing array 133 is a fingerprint identification region 103 of the fingerprint identification apparatus 130. As shown in FIG. 1A, the fingerprint identification region 103 is located in a display region of the display screen 120. In an alternative implementation manner, the fingerprint identification apparatus 130 is disposed at other positions, such as a side of the display screen 120 or an edge non-light transmitting region of the electronic device 10, and a light signal from at least part of the display region of the display screen 120 is directed to the fingerprint identification apparatus 130 through a light path design, such that the fingerprint identification region 103 is actually located in the display region of the display screen 120.

It should be understood that an area of the fingerprint identification region 103 may be different from an area of the sensing array 133 of the fingerprint identification apparatus 130. For example, the area of the fingerprint identification region 103 of the fingerprint identification apparatus 130 is larger than the area of the sensing array 133 of the fingerprint identification apparatus 130 through a light path design such as lens imaging, reflective folding, or light convergence or reflection, etc. In other alternative implementation manners, if a light path is directed in a manner of light collimation for example, the area of the fingerprint identification region 103 of the fingerprint identification apparatus 130 may also be designed to be substantially identical with the area of the sensing array 133 of the fingerprint identification apparatus 130.

Therefore, when a user needs to unlock the electronic device 10 or perform other fingerprint verification, a fingerprint input can be implemented merely by pressing a finger on the fingerprint identification region 103 in the display screen 120. Since fingerprint detection may be implemented in the screen, there is no need to exclusively reserve space for a front surface of the electronic device 10 adopting the foregoing structure to set a fingerprint button (such as a Home button), so that a full screen solution may be adopted; that is, the display region of the display screen 120 may be substantially extended to an entire front surface of the electronic device 10.

As an optional implementation manner, as shown in FIG. 1B, the fingerprint identification apparatus 130 includes a light detecting portion 134 and an optical component 132. The light detecting portion 134 includes the sensing array 133 and a readout circuit and other auxiliary circuits electrically connected to the sensing array 133, and may be fabricated on a die by a semiconductor process, to form an optical fingerprint sensor (which is also referred to as an optical fingerprint chip, a sensor, a sensor chip, a chip, etc.). The sensing array 133 is specifically a photodetector array including a plurality of photodetectors distributed in an array, and the photodetectors may serve as the optical sensing units as described above. The optical component 132 may be disposed above the sensing array 133 of the light detecting portion 134, and may specifically include a filter layer, a light directing layer or a light path directing structure, and other optical elements. The filter layer may be used to filter ambient light passing through a finger, and the light directing layer is mainly used to direct reflected light reflected from a finger surface to the sensing array 133 for fingerprint detection.

In a specific implementation, the optical component 132 and the light detecting portion 134 may be encapsulated in the same optical fingerprint member. For example, the optical component 132 and the light detecting portion 134 may be encapsulated in the same optical fingerprint chip, or the optical component 132 may be disposed outside a chip where the light detecting portion 134 is located, for example, the optical component 132 is attached above the chip, or a part of elements of the optical component 132 are integrated into the chip.

There are various implementations for the light directing layer of the optical component 132. For example, the light directing layer may be specifically a collimator layer fabricated on a semiconductor silicon wafer and having a plurality of collimating units or micro-pore arrays, and the collimating unit may be specifically a small hole. Light in the reflected light reflected from the finger that is vertically incident on the collimating unit may pass through the collimating unit and be received by the optical sensing unit below the collimating unit, and light with an excessively large incident angle is attenuated through multiple reflection inside the collimating unit. Therefore, each optical sensing unit may substantially only receive the reflected light reflected from a fingerprint pattern right above the optical sensing unit, and thus the sensing array 133 may detect a fingerprint image of the finger.

In another implementation manner, the light directing layer may also be an optical lens layer having one or more lens units, for example, a lens group composed of one or more aspheric lenses, for converging reflected light reflected from a finger to the sensing array 133 of the light detecting portion 134 below the optical lens layer, so that the sensing array 133 may perform imaging based on the reflected light so as to obtain a fingerprint image of the finger. Optionally, the optical lens layer may be provided with a pinhole in a light path of the lens unit, and the pinhole may cooperate with the optical lens layer to expand a field of view of the fingerprint identification apparatus 130, to improve a fingerprint imaging effect of the fingerprint identification apparatus 130.

In other implementation manners, the light directing layer may also specifically adopt a micro-lens layer, the micro-lens layer has a micro-lens array constituted by a plurality of micro-lenses, which may be formed above the sensing array 133 of the light detecting portion 134 by a semiconductor growth process or other processes, and each micro-lens may correspond to one of the sensing units in the sensing array 133 respectively. Other optical film layers such as a dielectric layer or a passivation layer may be formed between the micro-lens layer and the sensing unit. Further, a light blocking layer (or referred to as a light shielding layer, a light resisting layer, etc.) having a micro-pore may also be formed between the micro-lens layer and the sensing unit, where the micro-pore is formed between the corresponding micro-lens and the sensing unit, and the light blocking layer may block optical interference between adjacent micro-lenses and the sensing units, such that light corresponding to the sensing unit is converged to the interior of the micro-pore through the micro-lens and is transmitted to the sensing unit via the micro-pore to perform optical fingerprint imaging.

It should be understood that several implementations of the forgoing light directing layer may be used alone or in combination. For example, a micro-lens layer may be further disposed above or below the collimator layer or the optical lens layer. Certainly, when the collimator layer or the optical lens layer is used in combination with the micro-lens layer, the specific laminated structure or light path may require to be adjusted according to actual needs.

As an optional implementation manner, the display screen 120 may adopt a display screen with a self-emitting display unit, for example, an organic light-emitting diode (OLED) display screen or a micro light-emitting diode (Micro-LED) display screen. Taking an OLED display screen as an example, the optical fingerprint identification apparatus 130 may use a display unit (that is, an OLED light source) of the OLED display screen 120 located in the fingerprint identification region 103 as an excitation light source for optical fingerprint detection. When a finger 140 is pressed against the fingerprint identification region 103, the display screen 120 emits a beam of light 111 to a finger 140 above the fingerprint identification region 103, and the light 111 is reflected by a surface of the finger 140 to form reflected light or form scattered light after scattering inside the finger 140. In related patent applications, the reflected light and scattered light are also collectively referred to as reflected light for convenience of description. Since a ridge 141 and a valley 142 of a fingerprint have different light reflecting abilities, reflected light 151 from the ridge of the fingerprint and reflected light 152 from the valley of the fingerprint have different light intensities. After passing through the optical component 132, the reflected light is received by the sensing array 133 in the fingerprint identification apparatus 130 and converted into a corresponding electrical signal, that is, a fingerprint detection signal. Fingerprint image data can be obtained based on the fingerprint detection signal, and fingerprint matching verification can be further performed, thereby implementing an optical fingerprint identification function in the electronic device 10.

In other implementation manners, the fingerprint identification apparatus 130 may also use an internal light source or an external light source to provide a light signal for fingerprint detection. In this case, the fingerprint identification apparatus 130 may be applied to a non-self-emitting display screen, such as a liquid crystal display screen or other passive light-emitting display screens. As an example, in a case where a liquid crystal display screen having a backlight module and a liquid crystal panel is applied, in order to support under-screen fingerprint detection of the liquid crystal display screen, the optical fingerprint system of the electronic device 10 may further include an excitation light source for optical fingerprint detection. The excitation light source may specifically be an infrared light source or a light source of non-visible light with a specific wavelength, which may be disposed under the backlight module of the liquid crystal display screen or disposed in an edge region under a protective cover of the electronic device 10. The fingerprint identification apparatus 130 may be disposed under the liquid crystal panel or the edge region of the protective cover, and by being directed over a light path, light for fingerprint detection may reach the fingerprint identification apparatus 130. Alternatively, the fingerprint identification apparatus 130 may also be disposed under the backlight module, and the backlight module allows the light for fingerprint detection to pass through the liquid crystal panel and the backlight module and reach the fingerprint identification apparatus 130 by providing a hole on film layers such as a diffusion sheet, a brightening sheet, a reflection sheet or the like, or by performing other optical designs. When the fingerprint identification apparatus 130 uses an internal light source or an external light source to provide a light signal for fingerprint detection, a detection principle is consistent with the foregoing description.

It should be understood that, in a specific implementation, the electronic device 10 may further include a transparent protective cover; and the cover may be a glass cover or a sapphire cover, which is located above the display screen 120 and covers a front surface of the electronic device 10. Therefore, in an embodiment of the present application, the so-called the finger being pressed against the display screen 120 actually refers to the finger being pressed against a cover above the display screen 120 or a surface of a protective layer covering the cover.

The electronic device 10 may further include a circuit board 150 that is disposed under the fingerprint identification apparatus 130. The fingerprint identification apparatus 130 may be bonded to the circuit board 150 by a back adhesive, and achieve electrical connection with the circuit board 150 by welding of a pad and a mental wire. The fingerprint identification apparatus 130 may achieve electrical interconnection and signal transmission with other peripheral circuits or other elements of the electronic device 10 through the circuit board 150. For example, the fingerprint identification apparatus 130 may receive a control signal of a processing unit of the electronic device 10 through the circuit board 150, and may also output a fingerprint detection signal from the fingerprint identification apparatus 130 to the processing unit, a control unit and the like of the electronic device 10 through the circuit board 150.

In some implementation manners, the fingerprint identification apparatus 130 may only include one optical fingerprint sensor, and in this case, the fingerprint identification region 103 of the fingerprint identification apparatus 130 has a smaller area and a fixed position, and therefore, when a fingerprint input is performed, a user needs to press a finger at a specific position of the fingerprint identification region 103, otherwise the fingerprint identification apparatus 130 may not be able to capture a fingerprint image, thereby resulting in poor user experience. In other alternative embodiments, the fingerprint identification apparatus 130 may include a plurality of optical fingerprint sensors. The plurality of optical fingerprint sensors may be disposed under the display screen 120 side by side in a splicing manner, and sensing regions of the plurality of optical fingerprint sensors collectively constitute the fingerprint identification region 103 of the fingerprint identification apparatus 130. Thus the fingerprint identification region 103 of the fingerprint identification apparatus 130 may be extended to a main region of a lower half part of the display screen, that is, to a customary pressing region of a finger, thereby implementing a blind pressing type of fingerprint input operation. Further, when the number of the optical fingerprint sensors is sufficient, the fingerprint identification region 103 may also be extended to a half of the display region or even the entire display region, thereby achieving half-screen or full-screen fingerprint detection.

For example, in an electronic device 10 as shown in FIG. 2A and FIG. 2B, a fingerprint identification apparatus 130 in the electronic device 10 includes a plurality of optical fingerprint sensors, and the plurality of optical fingerprint sensors may be disposed under a display screen 120 side by side in a splicing manner or the like for example, and sensing regions of the plurality of optical fingerprint sensors collectively constitute a fingerprint identification region 103 of the fingerprint identification apparatus 130.

Optionally, corresponding to the plurality of optical fingerprint sensors of the fingerprint identification apparatus 130, an optical component 132 may include a plurality of light directing layers, and each light directing layer respectively corresponds to one optical fingerprint sensor and is respectively attached to be disposed above the corresponding optical fingerprint sensor. Alternatively, the plurality of optical fingerprint sensors may also share an integral light directing layer, i.e., the light directing layer has a sufficiently large area to cover the sensing array of the plurality of optical fingerprint sensors.

In addition, the optical component 132 may further include other optical elements, for example, a filter layer or other optical films, which may be disposed between the light directing layer and the optical fingerprint sensor, or between the display screen 120 and the light directing layer, for mainly isolating the influence of external interference light on optical fingerprint detection. The filter may be used to filter out ambient light that penetrates a finger and enters into the optical fingerprint sensors via the display screen 120. Similar to the light directing layer, the filter may be separately provided for each of the optical fingerprint sensors to filter out interference light, or a large-area filter may also be used to cover the plurality of optical fingerprint sensors simultaneously.

The light directing layer may also be replaced by an optical lens (Lens), and a small hole may be formed by a light-shielding material above the optical lens to cooperate with the optical lens to converge fingerprint detection light to the optical fingerprint sensor under the optical lens, thereby achieving fingerprint imaging. Similarly, each optical fingerprint sensor may be separately configured with an optical lens for fingerprint imaging, or the plurality of optical fingerprint sensors may also utilize the same optical lens to achieve light convergence and fingerprint imaging. In other alternative embodiments, each optical fingerprint sensor may even further have dual sensing arrays or multiple sensing arrays, and two or more optical lenses are simultaneously configured to cooperate with the two or more sensing arrays for optical imaging so as to reduce an imaging distance and enhance an imaging effect.

Different fingerprint identification environments correspond to different capturing parameters, where the capturing parameter is a parameter used when the fingerprint identification apparatus captures a fingerprint light signal, and the capturing parameter may be, but is not limited to, an exposure time. For example, an exposure time for capturing a fingerprint light signal is shorter in a strong light environment and longer in a dark light environment. If the fingerprint identification apparatus cannot accurately identify the current fingerprint identification environment when capturing the fingerprint light signal, for example, the strong light environment is misjudged as a normal environment, the capturing parameter used when the fingerprint identification apparatus captures the fingerprint light signal may not correspond to the fingerprint identification environment, and the fingerprint image may be presented as a mosaic or other forms, which increases a false rejection rate (FRR) and a false acceptance rate (FAR), and greatly reduces the accuracy of fingerprint identification.

In view of this, an embodiment of the present application provides a fingerprint identification apparatus, which can identify a fingerprint identification environment and then capture a fingerprint light signal based on the fingerprint identification environment, thereby improving the accuracy of fingerprint identification.

It should be noted that the fingerprint identification apparatus in the embodiment of the present application may also be referred to as an optical fingerprint identification module, an optical fingerprint apparatus, a fingerprint identification module, a fingerprint module, a fingerprint capturing apparatus, or the like, and the foregoing terms may be replaced with each other.

Hereinafter, a fingerprint identification apparatus according to an embodiment of the present application will be described in detail with reference to FIGS. 3 to 9.

It should be noted that in embodiments shown below, the same structures are denoted by the same reference numerals for ease of understanding, and detailed description of the same structures is omitted for brevity.

It should be understood that the number and arrangement manners of pixels, and filter units in embodiments of the present application shown below are merely illustrative and should not constitute any limitation to the present application.

Figure 3:
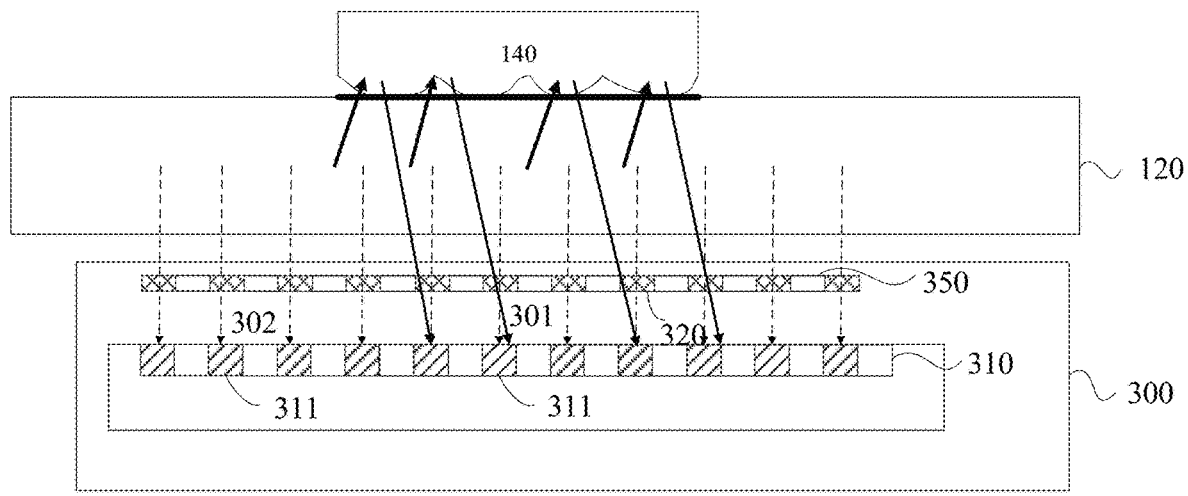
FIG. 3 is a schematic structural diagram of a fingerprint identification apparatus according to an embodiment of the present application.

FIG. 3 is a schematic structural diagram of a fingerprint identification apparatus 300 according to an embodiment of the present application. The fingerprint identification apparatus 300 is disposed under a display screen 120 for under-screen fingerprint identification. As shown in FIG. 3, the fingerprint identification apparatus 300 may include a pixel array 310 and a colour filter (CF) layer 350.

The pixel array 310 is configured to capture a fingerprint light signal 301 returned by reflection or scattering of a finger above the display screen, and the fingerprint light signal 301 is used for fingerprint identification. The colour filter layer 350 includes at least one filter unit 320, the at least one filter unit 320 is disposed above at least one first type pixel 311 of the pixel array 310, respectively, and the at least one first type pixel 311 is configured to sense a first light signal 302 transmitting through the at least one filter unit 320, and an intensity of the first light signal 302 is used for determining a fingerprint identification environment, to obtain a target capturing parameter of capturing the fingerprint light signal 301, and the target capturing parameter is a capturing parameter of the fingerprint identification apparatus 300.

It should be understood that the fingerprint identification apparatus 300 may correspond to the foregoing fingerprint identification apparatus 130, and other details of the fingerprint identification apparatus 300 may refer to the foregoing description for the fingerprint identification apparatus 130.

According to an embodiment of the application, the fingerprint identification apparatus includes a filter unit disposed above a pixel, and the filter unit may transmit through light signals in different colors, so that the pixel may sense the light signals in different colors, so as to determine a fingerprint identification environment based on the sensed light signals in different colors, thereby determining a capturing parameter for capturing a fingerprint light signal corresponding to the fingerprint identification environment, and thus the accuracy of fingerprint identification based on the capturing parameter is higher.

Optionally, at least one filter unit 320 may be in one-to-one correspondence with at least one first type pixel 311.

The at least one filter unit 320 may include a red filter unit and/or a blue filter unit. The red filter unit is configured to transmit through a red light signal and the blue filter unit is configured to transmit through a blue light signal. When the at least one filter unit 320 includes a red filter unit, the first light signal 302 includes a red signal; when the at least one filter unit 320 includes a blue filter unit, the first light signal 302 includes a blue light signal; and when the at least one filter unit 320 includes a red filter unit and a blue filter unit, the first light signal 302 includes a red light signal and a blue light signal.

Certainly, the at least one filter unit 320 may also include other filter units, such as a green filter unit, or the like, which is not specifically limited in the embodiment of the present application.

It should be understood that the term "and/or" herein merely describes association relations between associated objects, and denotes three relations, for example, A and/or B may denote three situations, namely A exists separately, A and B exist simultaneously and B exists separately.

Figure 4:
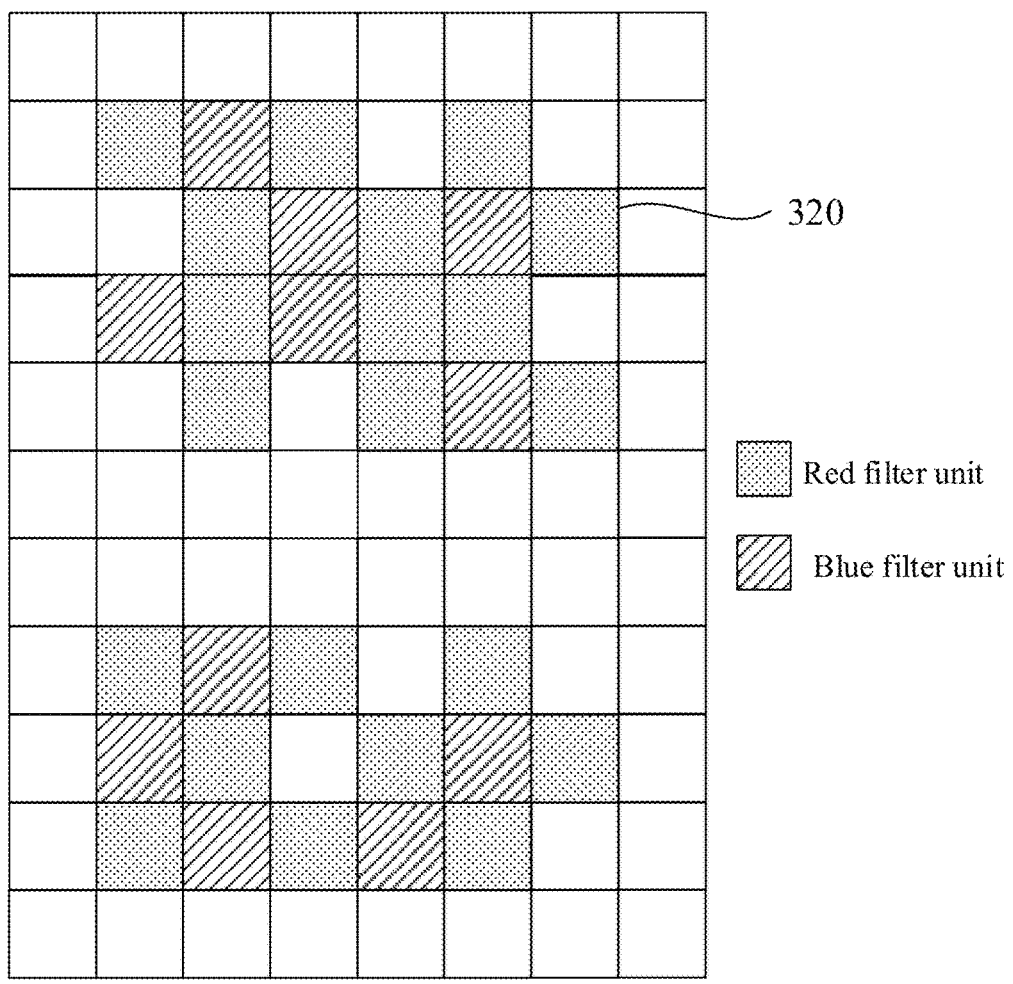
FIGS. 4-8 are schematic diagrams of distribution manners of filter units according to embodiments of the present application.

The at least one filter unit 320 may be distributed on the colour filter layer 350 in a certain manner. As an example, the at least one filter unit 320 may be non-uniformly arranged on the colour filter layer 350. As shown in FIG. 4, at least one filter unit 320 includes a red filter unit and a blue filter unit, and the red filter unit and the blue filter unit are non-uniformly distributed on the colour filter layer 350.

Figure 5:
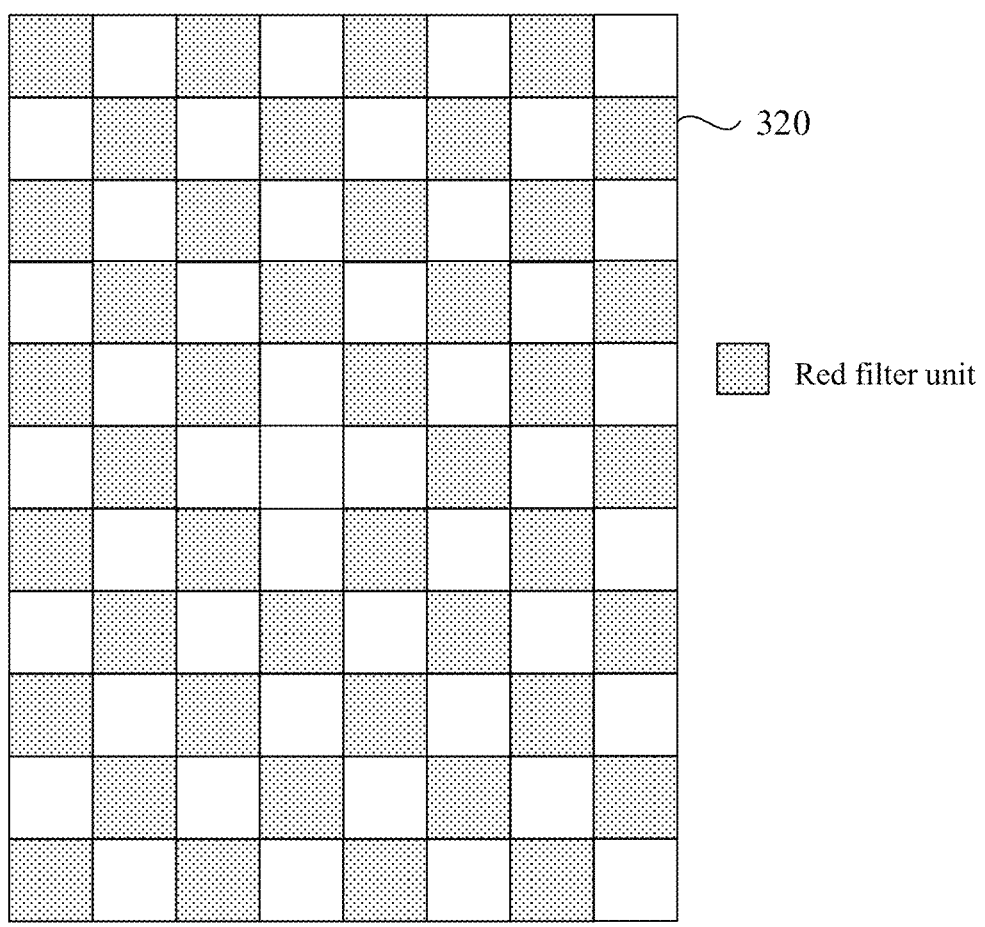

As another example, at least one filter unit 320 may be uniformly arranged on the colour filter layer 350. As shown in FIG. 5, at least one filter unit 320 includes red filter units, and the red filter units are arranged on the colour filter layer 350 at an interval.

According to the distribution manners of the at least one filter unit 320 shown in FIG. 4 and FIG. 5, the accuracy of determining a fingerprint identification environment is relatively high, which could further improve the accuracy of fingerprint identification.

Figure 6:
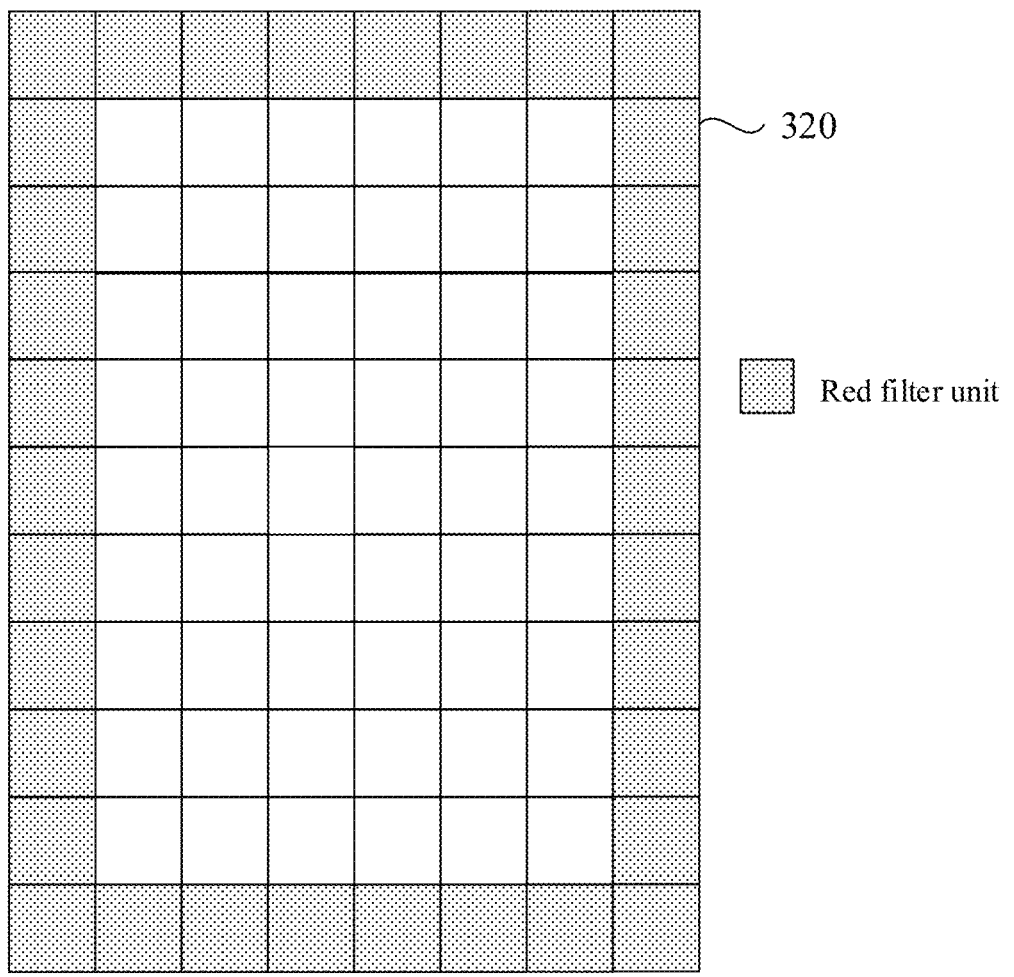
Figure 7:
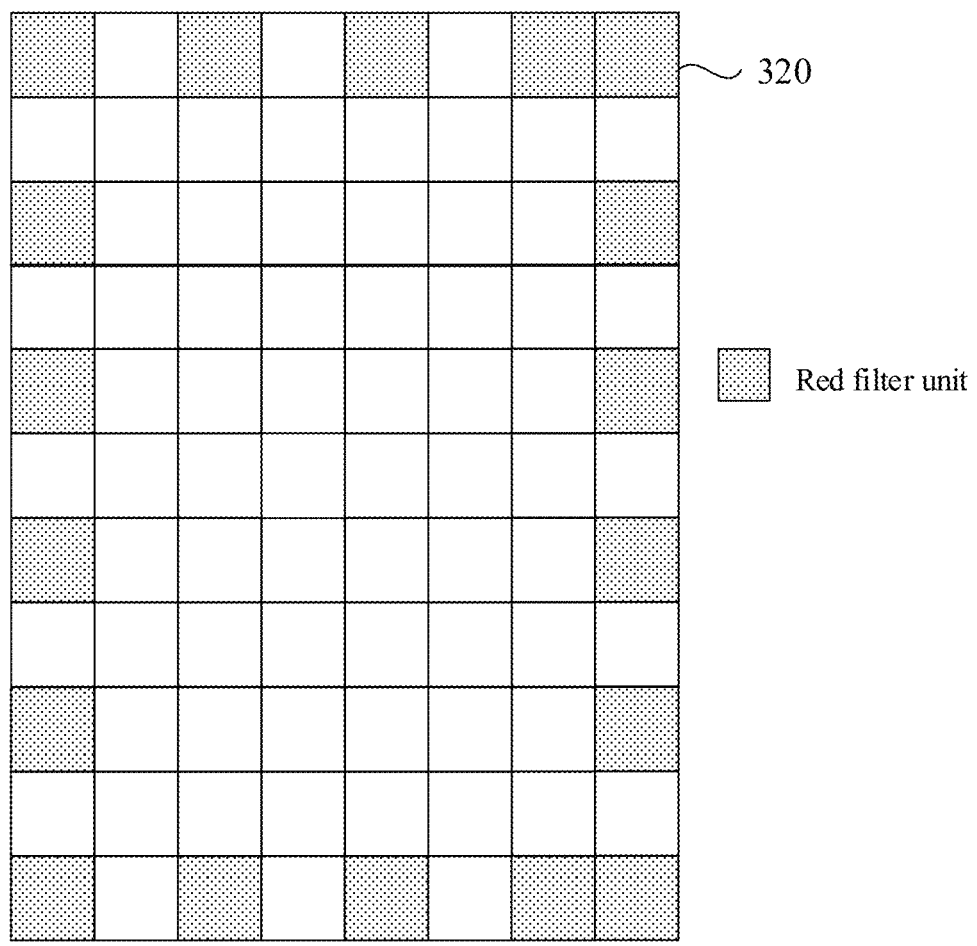
Figure 8:
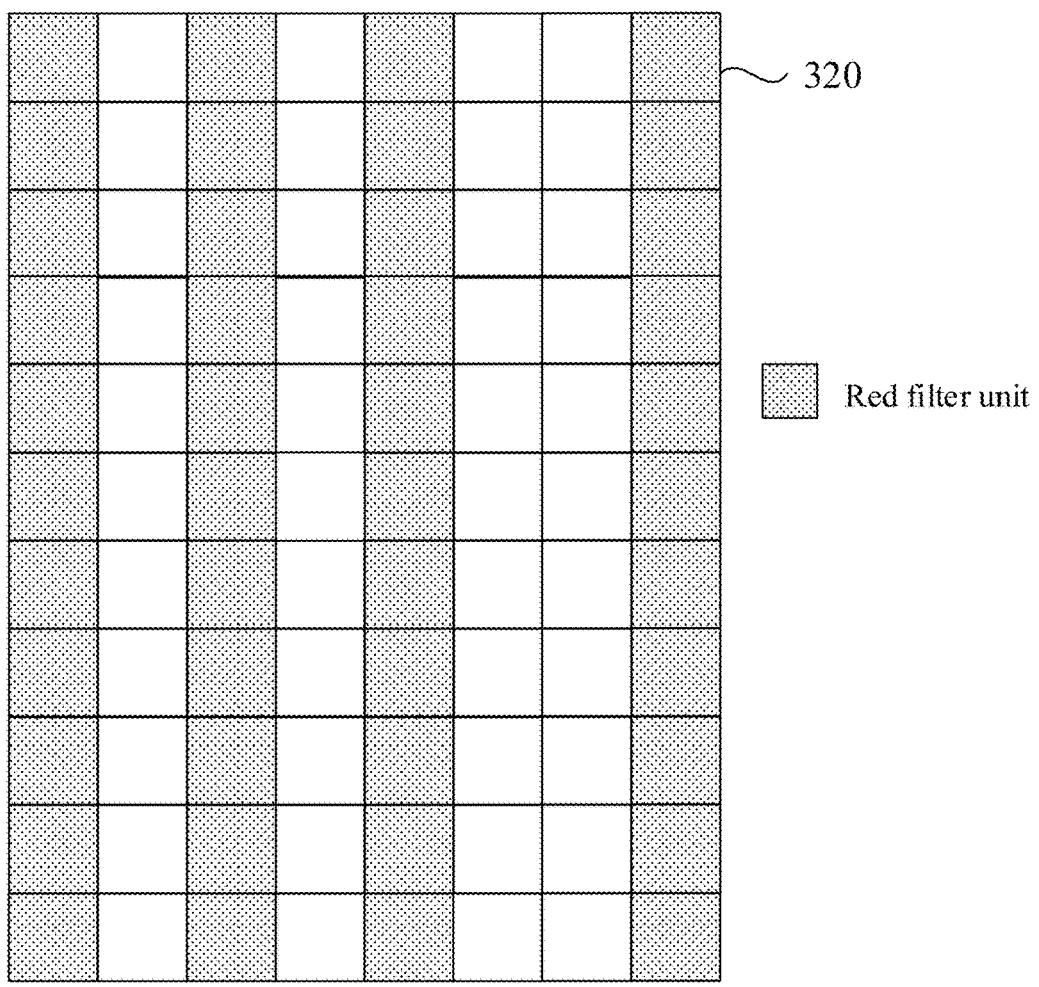

As another example, at least one filter unit 320 may be distributed in an edge region of the colour filter layer 350. As shown in FIG. 6 and FIG. 7, at least one filter unit 320 includes red filter units, and the red filter units are distributed in an edge region of the colour filter layer 350 in FIG. 6, and the red filter units are discretely distributed in an edge region of the colour filter layer 350 in FIG. 7. Illustratively, at least one filter unit 320 may be arranged in the edge region of the colour filter layer 350 at an interval.

The embodiment of the present application does not specifically limit the edge region of the colour filter layer 350. For example, the edge region of the colour filter layer 350 may be a region of at least one circle of colour filter units on the outermost side of the colour filter layer 350. For example, the edge region of the colour filter layer 350 may be a region of the outermost circle of the colour filter layer 350, as shown in FIGS. 6 and 7. Alternatively, the edge region of the colour filter layer 350 may be a region of the outermost two circles of the colour filter layer 350.

According to the distribution manners of the at least one filter unit 320 shown in FIG. 6 and FIG. 7, the consumption of the filter unit is relatively small, which could reduce the cost of the fingerprint identification apparatus.

It should be understood that FIGS. 4-7 are only exemplary distribution diagrams of at least one filter unit 320 in the embodiment of the present application, and the at least one filter unit 320 may also be distributed on the colour filter layer 350 in other manners. For example, at least one filter unit 320 may be distributed on the colour filter layer 350 in a manner shown in FIG. 8.

It should also be understood that there may be a certain region between two filter units of at least one filter unit 320.

In an embodiment of the present application, the colour filter layer 350 may be located at any position in a light path that is from a lower surface of the display screen 120 to an upper surface of the pixel array 310.

Optionally, the first light signal 302 may be a light signal transmitting through all filter units of the at least one filter unit 320.

Alternatively, the first light signal 302 may be a light signal transmitting through some filter units of the at least one filter unit 320. The some filter units may be N discrete filter units of the at least one filter unit 320, or may be filter units of the at least one filter unit 320 in a designated region.

Optionally, the first light signal 302 may or may not include the fingerprint light signal 301, which is not specifically limited in the embodiment of the present application.

Figure 9:
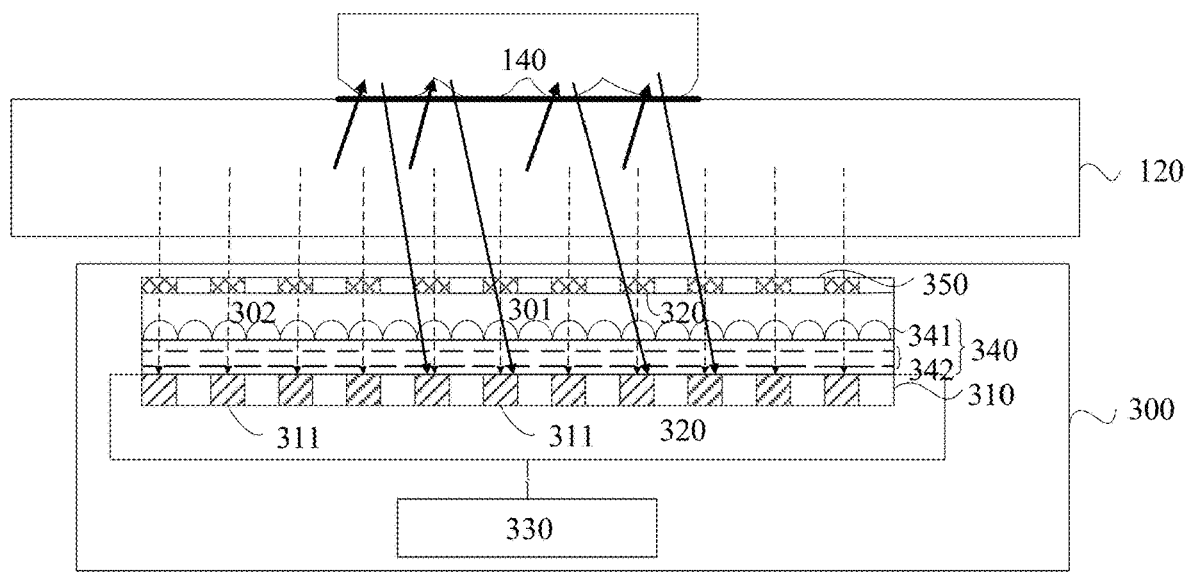
FIG. 9 is a schematic structural diagram of another fingerprint identification apparatus according to an embodiment of the present application.

Optionally, in an embodiment of the present application, as shown in FIG. 9, a fingerprint identification apparatus 300 may further include a processor 330, and the processor 300 may be configured to determine a fingerprint identification environment based on an intensity of a first light signal 302, and then determine a target capturing parameter based on the determined fingerprint identification environment.

The processor 330 may be a processor in the fingerprint identification apparatus 300 or may be a processor in an electronic device where the fingerprint identification apparatus 300 is located, which is not limited in the embodiment of the present application. The processor 330 may be a central processing unit (CPU), and the processor may also be another general-purpose processor, a digital signal processor (DSP), an application-specific integrated circuit (ASIC), a field-programmable gate array (FPGA) or another programmable logic device, a discrete gate or a transistor logic device, a discrete hardware component or the like. The general-purpose processor may be a microprocessor or the processor may be any conventional processor or the like.

A specific implementation in which a processor 330 determines a fingerprint identification environment based on an intensity of a first light signal 302 will be described in detail below.

In one implementation manner, if all the at least one filter unit 320 is a red filter unit, the first light signal 302 includes a red light signal. If an intensity of the red light signal is greater than a preset red light signal intensity, the processor 330 may determine that the fingerprint identification environment is a strong light environment; and if an intensity of the red light signal is less than or equal to a preset red light signal intensity, the processor 330 may determine that the fingerprint identification environment is a normal environment.

In another implementation manner, if all the at least one filter unit 320 is a blue filter unit, the first light signal 302 includes a blue light signal. If an intensity of the blue light signal is greater than a preset blue light signal intensity, the processor 330 may determine that the fingerprint identification environment is a specific environment.

The specific environment may refer to an environment with a larger amount of blue light components, for example, a blue light component in a specific environment may be greater than twice as large as a blue light component in a normal environment, such as an environment irradiated by an ultraviolet lamp. The light intensity in a strong light environment may be greater than 10,000 lux, for example, the light intensity may be 15,000 lux or 20,000 lux. The normal environment may be an environment where it is indoors and a light source is a light emitting diode (LED) light source, such as a laboratory, a factory, or the like, and the light intensity in the normal environment may be less than or equal to 10,000 lux.

In another implementation manner, if at least one filter unit 320 includes a red filter unit and a blue filter unit, the first light signal 302 includes a red light signal and a blue light signal. The processor 330 may first compare an intensity of the red light signal with a preset red light signal intensity, and if the intensity of the red light signal is greater than the preset red light signal intensity, the processor 330 may determine that the fingerprint identification environment is a strong light environment. If the intensity of the red light signal is less than the preset red light signal intensity, the processor 330 may compare an intensity of the blue light signal with a preset blue light signal intensity, and if the intensity of the blue light signal is greater than the preset blue light signal intensity, the processor 330 may determine that the fingerprint identification environment is a specific environment. If the intensity of the blue light signal is less than the preset blue light signal intensity, the processor 330 may determine that the fingerprint identification environment is a normal environment.

Alternatively, the processor 330 may first compare an intensity of the blue light signal with a preset blue light signal intensity, and if the intensity of the blue light signal is greater than the preset blue light signal intensity, the processor 330 may determine that the fingerprint identification environment is a specific environment. If the intensity of the blue light signal is less than the preset blue light signal intensity, the processor 330 may compare the intensity of the red light signal with the preset red light signal intensity, and if the intensity of the red light signal is greater than the preset red light signal intensity, the processor 330 may determine that the fingerprint identification environment is a strong light environment. If the intensity of the red light signal is less than the preset red light signal intensity, the processor 330 may determine that the fingerprint identification environment is a normal environment.

Alternatively, the processor 330 may compare the intensity of the blue light signal with the preset blue light signal intensity while comparing the intensity of the red light signal with the preset red light signal intensity.

The preset light signal intensity mentioned above, such as the preset red light signal intensity and the preset blue light signal intensity may be a light signal intensity in a normal environment.

After determining the fingerprint identification environment, the processor 330 may determine the target capturing parameter based on the fingerprint identification environment.

Optionally, the capturing parameter may include an exposure time.

Optionally, the capturing parameter may include an exposure time and a gain parameter.

In a possible embodiment, the processor 330 may determine the target capturing parameter according to the determined fingerprint identification environment (referred to as a target environment here for convenience of description) and a correspondence relationship between the fingerprint identification environment and the capturing parameter.

For example, in the correspondence relationship between fingerprint identification environment and the capturing parameter, an exposure time corresponding to a strong light environment is 0.2 ms, an exposure time corresponding to a specific environment is 1 ms, and an exposure time corresponding to a normal environment is 0.5 ms. If the target environment is a strong light environment, the processor 330 may determine that the target capturing parameter is 0.2 ms.

In another possible embodiment, the processor 330 may determine an adjustment amount of a preset capturing parameter according to a variation of ambient light in the fingerprint identification environment relative to preset ambient light, so as to obtain the target capturing parameter. In other words, the processor 330 may determine the target capturing parameter through the variation of the ambient light.

The preset ambient light may be ambient light in a normal environment, and the preset capturing parameter may be a capturing parameter used by the pixel array 310 that captures the fingerprint light signal 301 in a normal environment, that is, under the preset ambient light. The intensity of the red light signal under the preset ambient light is the preset red light signal intensity mentioned above, and the intensity of the blue light signal under the preset ambient light is the preset blue light signal intensity mentioned above.

If the capturing parameter is an exposure time, when the fingerprint identification environment is a strong light environment, a target exposure time may be a difference between a preset exposure time and an adjustment amount, that is, the processor 330 may decrease the exposure time; when the fingerprint identification environment is a specific environment, the target exposure time may be a sum of the preset exposure time and the adjustment amount, that is, the processor 330 may increase the exposure time; and if the fingerprint identification environment is a normal environment, the adjustment amount is zero, and the processor 330 may not adjust the preset capturing parameter, that is, the target capturing parameter is a preset capturing parameter.

If the capturing parameter includes an exposure time and a gain parameter, when the fingerprint identification environment is a strong light environment, a target product may be a difference between a preset product and an adjustment amount, where the target product is a product of the target exposure time and the target gain parameter, and the preset product is a product of the preset exposure time and the preset gain parameter. In a specific implementation, the processor 330 may increase the preset exposure time and decrease the preset gain parameter; or, the processor 330 may not adjust the preset exposure time and decrease the preset gain parameter; or, the processor 330 may decrease the preset exposure time and preset gain parameter.

When the fingerprint identification environment is a normal environment, the adjustment amount is zero, and the processor 330 may not adjust the product of the preset exposure time and the preset gain parameter, that is, the product of the target exposure time and the target gain parameter is the product of the preset exposure time and the preset gain parameter.

When the fingerprint identification environment is a specific environment, the target product may be the sum of the preset product and the adjustment amount. In a specific implementation, the processor 330 may increase the preset exposure time and the preset gain parameter; or, the processor 330 may not adjust the preset exposure time and increase the preset gain parameter; or, the processor 330 may decrease the preset exposure time and increase the preset gain parameter.

After the target capturing parameter is determined, the pixel array 310 may capture the fingerprint light signal 301 by using the target capturing parameter, and obtain a fingerprint image based on the fingerprint light signal 301 for fingerprint identification.

Alternatively, the pixel array 310 may capture the first light signal 302 and the fingerprint light signal 301 at the same time. After the processor 330 determines the fingerprint identification environment based on the first light signal 302, the pixel array 310 may process the fingerprint light signal 310 by using a fingerprint algorithm corresponding to the fingerprint identification environment, so as to obtain a more accurate fingerprint image.

Optionally, in an embodiment of the present application, the fingerprint identification apparatus 300 may further include an optical component 340 disposed between the display screen 120 and the pixel array 310, configured to direct or converge the fingerprint light signal 301 to the pixel array 310 when a finger is pressed against the fingerprint identification region of the display screen 120.

The optical component 340 may correspond to the optical component 132 in FIG. 1, and the specific implementation may refer to the relevant description in the embodiment shown in FIG. 1, which will not be repeated here for brevity.

The optical component 340 may include at least one light shielding layer 342 and a micro-lens array 341. At least one light shielding layer 342 is provided with a plurality of light passing apertures; the micro-lens array 341 is disposed above the at least one light shielding layer 342, and is configured to converge the fingerprint light signal 301 reflected, scattered or transmitted by the finger to the plurality of light passing apertures of the at least one light shielding layer 342 when the finger is pressed against the display screen 120, and the fingerprint light signal 301 is transmitted to the pixel array 310 through the plurality of light passing apertures of the at least one light shielding layer 342.

The colour filter layer 350 may be disposed in a light path between the display screen 120 and the optical component 340, or disposed in a light path between the micro-lens array 341 and the pixel array 310. Specifically, the colour filter layer 350 may be disposed between the at least one light shielding layer 342 and the micro-lens array 341.

It should be understood that the fingerprint identification apparatus 300 of the embodiment of the present application may also be used for identification of a true or fake finger, determination of a fingerprint identification region, or the like.

The apparatus embodiment of the present application is described in detail with reference to FIGS. 3 to 9, and a method embodiment of the present application is described in detail below with reference to FIG. 10. It should be understood that the method embodiment corresponds to the apparatus embodiment, and similar description may refer to the apparatus embodiment.

Figure 10:
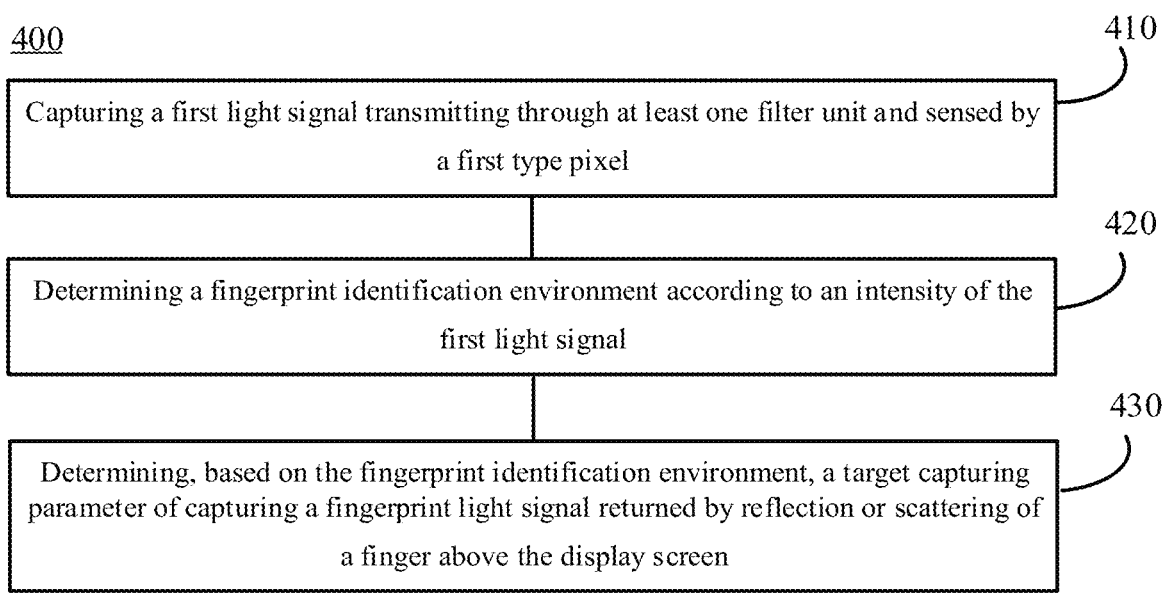
FIG. 10 is a schematic diagram of a fingerprint identification method according to an embodiment of the present application.

FIG. 10 shows a schematic flowchart of a fingerprint identification method 400 according to an embodiment of the present application. The method 400 may be applied to a fingerprint identification apparatus disposed under a display screen of an electronic device, and the fingerprint identification apparatus may include a pixel array and a colour filter layer, the colour filter layer includes at least one filter unit, and the at least one filter unit is disposed above at least one first type pixel of the pixel array, respectively. As shown in FIG. 10, the fingerprint identification method 400 may include the following steps:

in 410, capturing a first light signal transmitting through at least one filter unit and sensed by a first type pixel;

in 420, determining a fingerprint identification environment according to an intensity of the first light signal; and in 430, determining, based on the fingerprint identification environment, a target capturing parameter of capturing a fingerprint light signal returned by reflection or scattering of a finger above the display screen, the fingerprint light signal being used for fingerprint identification.

Optionally, in some embodiments, the at least one filter unit includes at least one red filter unit, the red filter unit is configured to transmit through a red light signal, and the first light signal includes the red light signal.

Optionally, in some embodiments, the determining the fingerprint identification environment according to the intensity of the first light signal includes: determining that the fingerprint identification environment is a strong light environment when an intensity of the red light signal is greater than a preset red light signal intensity; or determining that the fingerprint identification environment is a normal environment when an intensity of the red light signal is less than or equal to a preset red light signal intensity.

Optionally, in some embodiments, the at least one filter unit further includes at least one blue filter unit, the blue light signal is configured to transmit through a blue light signal, and the first light signal further includes the blue light signal.

Optionally, in some embodiments, the determining the fingerprint identification environment according to the intensity of the first light signal includes: determining that the fingerprint identification environment is a specific environment when an intensity of the red light signal is less than or equal to a preset red light signal intensity and an intensity of the blue light signal is greater than a preset blue light signal intensity.

Optionally, in some embodiments, the determining, based on the fingerprint identification environment, the target capturing parameter of capturing the fingerprint light signal returned by reflection or scattering of the finger above the display screen includes: determining an adjustment amount of a preset capturing parameter according to a variation of ambient light of the fingerprint identification environment based on preset ambient light, where under the preset ambient light, a capturing parameter of capturing the fingerprint light signal is the preset capturing parameter; and determining the target capturing parameter according to the preset capturing parameter and the adjustment amount.

Optionally, in some embodiments, the target capturing parameter includes a target exposure time and a target gain parameter, and the preset capturing parameter includes a preset exposure time and a preset gain parameter; if the fingerprint identification environment is a strong light environment, a target product is a difference between a preset product and the adjustment amount, where the target product is a product of the target exposure time and the target gain parameter, and the preset product is a product of the preset exposure time and the preset gain parameter; if the fingerprint identification environment is a normal environment, the adjustment amount is zero and the target product is the preset product; and if the fingerprint identification environment is a specific environment, the target product is a sum of the preset product and the adjustment amount.

Optionally, in some embodiments, when the fingerprint identification environment is the strong light environment, the preset exposure time is increased to the target exposure time, and the preset gain parameter is decreased to the target gain parameter; or the target exposure time is the preset exposure time, and the preset gain parameter is decreased to the target gain parameter; or the preset exposure time is decreased to the target exposure time, and the preset gain parameter is decreased to the target gain parameter.

Optionally, in some embodiments, when the fingerprint identification environment is the normal environment, the target exposure time is the preset exposure time, and the target gain parameter is the preset gain parameter.

Optionally, in some embodiments, when the fingerprint identification environment is the specific environment, the preset exposure time is increased to the target exposure time, and the preset gain parameter is increased to the target gain parameter; or the target exposure time is the preset exposure time, and the preset gain parameter is increased to the target gain parameter; or the preset exposure time is decreased to the target exposure time, and the preset gain parameter is increased to the target gain parameter.

Optionally, in some embodiments, a blue light component in the specific environment is greater than twice as large as a blue light component in a normal environment.

It should be understood that the method 400 shown in FIG. 10 may be executed by the fingerprint identification apparatus 300 in the foregoing embodiment, and the pixel array, the colour filter layer, the at least one filter unit and the first type pixel in the method 400 may be the pixel array 310, the colour filter layer 350, the at least one filter unit 320 and the first type pixels 311 in the fingerprint identification apparatus 300, respectively. It should be understood that the steps or operations in FIG. 10 are only examples, and other operations or variations of the operations in FIG. 10 may be further performed in the embodiment of the present application.

In order to understand the fingerprint identification method 400 more clearly, two specific implementation manners of the fingerprint identification method 400 are described below with reference to FIGS. 11 and 12.

Figure 11:
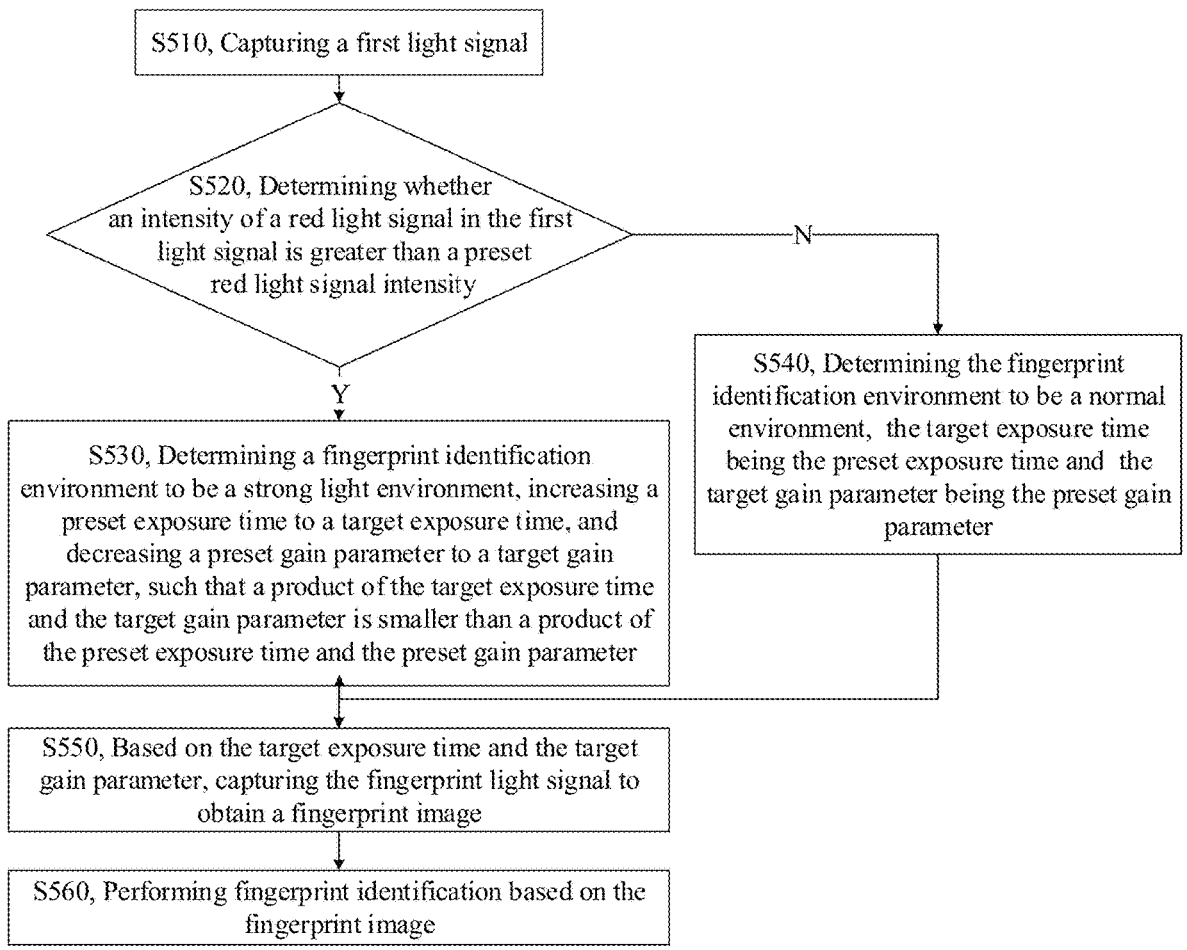
FIGS. 11 and 12 are schematic flowcharts of two specific implementations of a fingerprint identification method according to embodiments of the present application.

At least one filter unit in FIG. 11 includes a red filter unit, the first light signal includes a red light signal, and the capturing parameter includes an exposure time and a gain parameter.

S510, a first light signal is captured.

S520, whether an intensity of a red light signal in the first light signal is greater than a preset red light signal intensity is determined. If the intensity of the red light signal is greater than the preset red light signal intensity, S530 is executed; and if the intensity of the red light signal is less than or equal to the preset red light signal intensity, S540 is executed.

S530, a current fingerprint identification environment is determined to be a strong light environment, a preset exposure time is increased to a target exposure time, and a preset gain parameter is decreased to a target gain parameter, such that a product of the target exposure time and the target gain parameter is smaller than a product of the preset exposure time and the preset gain parameter. S550 is executed thereafter.

Optionally, if the current fingerprint identification environment is a strong light environment, the preset exposure time may not be adjusted, that is, the target exposure time is the preset exposure time, and the preset gain parameter may be decreased to the target gain parameter.

Alternatively, the preset exposure time may also be decreased to the target exposure time, and the preset gain parameter may be decreased to the target gain parameter.

S540, the current fingerprint identification environment is determined to be a normal environment, the preset exposure time and the preset gain parameter are not adjusted, that is, the preset exposure time is the target exposure time and the preset gain parameter is the target gain parameter, and a product of preset exposure time and the preset gain parameters is equal to a product of the target exposure time and the target gain parameter. S550 is executed thereafter.

S550, based on the target exposure time and the target gain parameter, the fingerprint light signal is captured and processed to obtain a fingerprint image.

S560, fingerprint identification is performed based on the fingerprint image.

Figure 12:
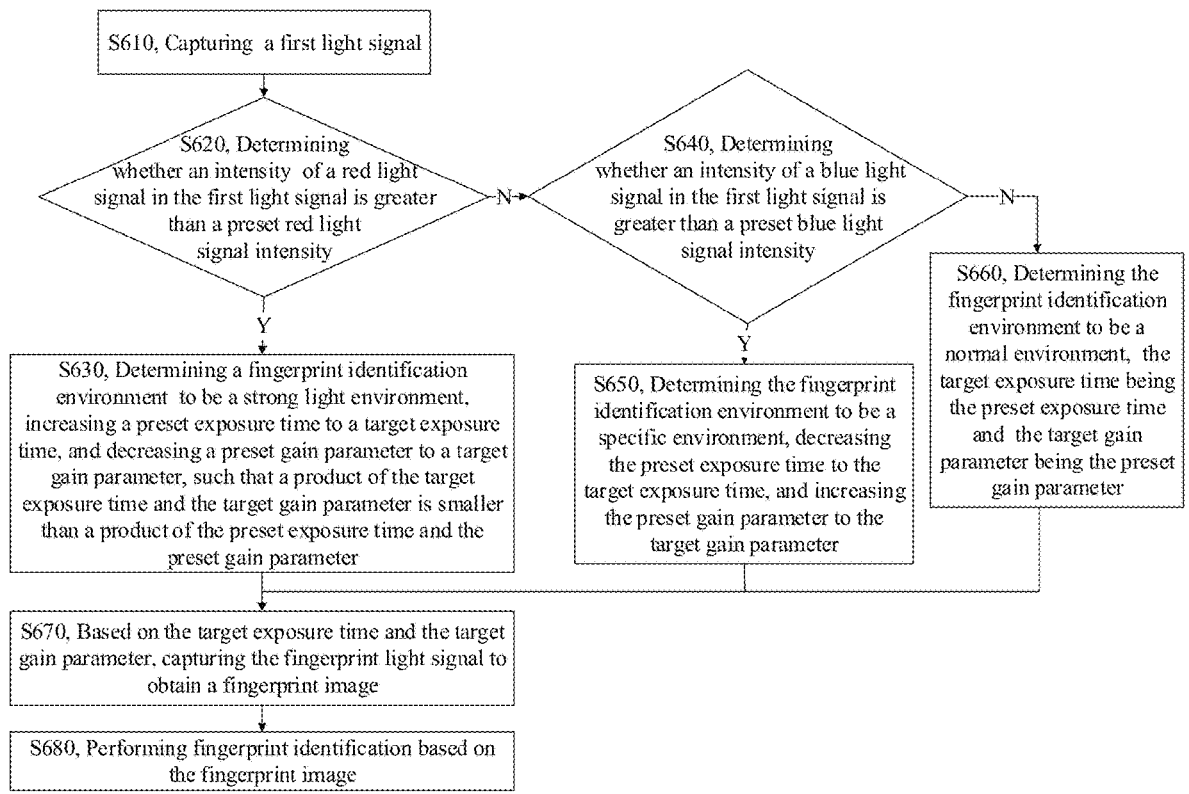

At least one filter unit in FIG. 12 includes a red filter unit and a blue filter unit, the first light signal includes a red signal and a blue signal, and the capturing parameter includes an exposure time and a gain parameter.

S610, a first light signal is captured.

S620, whether an intensity of a red light signal in the first light signal is greater than a preset red light signal intensity is determined. If the intensity of the red light signal is greater than the preset red light signal intensity, S630 is executed; and if the intensity of the red light signal is less than the preset red light signal intensity, S640 is executed.

S630, a current fingerprint identification environment is determined to be a strong light environment, a preset exposure time is increased to a target exposure time, and a preset gain parameter is decreased to a target gain parameter, such that a product of the target exposure time and the target gain parameter is smaller than a product of the preset exposure time and the preset gain parameter. S670 is executed thereafter.

Optionally, if the current fingerprint identification environment is a strong light environment, the preset exposure time may not be adjusted, that is, the target exposure time is the preset exposure time, and the preset gain parameter may be decreased to the target gain parameter.

Alternatively, the preset exposure time may also be decreased to the target exposure time, and the preset gain parameter may be decreased to the target gain parameter.

S640, whether an intensity of a blue light signal in the first light signal is greater than a preset blue light signal intensity is determined. If the intensity of the blue light signal is greater than the preset blue light signal intensity, S650 is executed; and if the intensity of the blue light signal is less than or equal to the preset blue light signal intensity, S660 is executed.

S650, the current fingerprint identification environment is determined to be a specific environment, the preset exposure time is decreased to the target exposure time, and the preset gain parameter is increased to the target gain parameter, such that a product of the target exposure time and the target gain parameter is greater than a product of the preset exposure time and the preset gain parameter. S670 is executed thereafter.

Optionally, if the current fingerprint identification environment is a specific environment, the preset exposure time may not be adjusted, that is, the target exposure time is the preset exposure time, and the preset gain parameter may be increased to the target gain parameter.

Alternatively, the preset exposure time may also be increased to the target exposure time, and the preset gain parameter may be increased to the target gain parameter.

S660, the current fingerprint identification environment is determined to be a normal environment, the preset exposure time and the preset gain parameter are not adjusted, that is, the preset exposure time is the target exposure time and the preset gain parameter is the target gain parameter, and a product of preset exposure time and the preset gain parameters is equal to a product of the target exposure time and the target gain parameter. S670 is executed thereafter.

S670, based on the target exposure time and the target gain parameter, the fingerprint light signal is captured and processed to obtain a fingerprint image.

S680, fingerprint identification is performed based on the fingerprint image.

Figure 13:
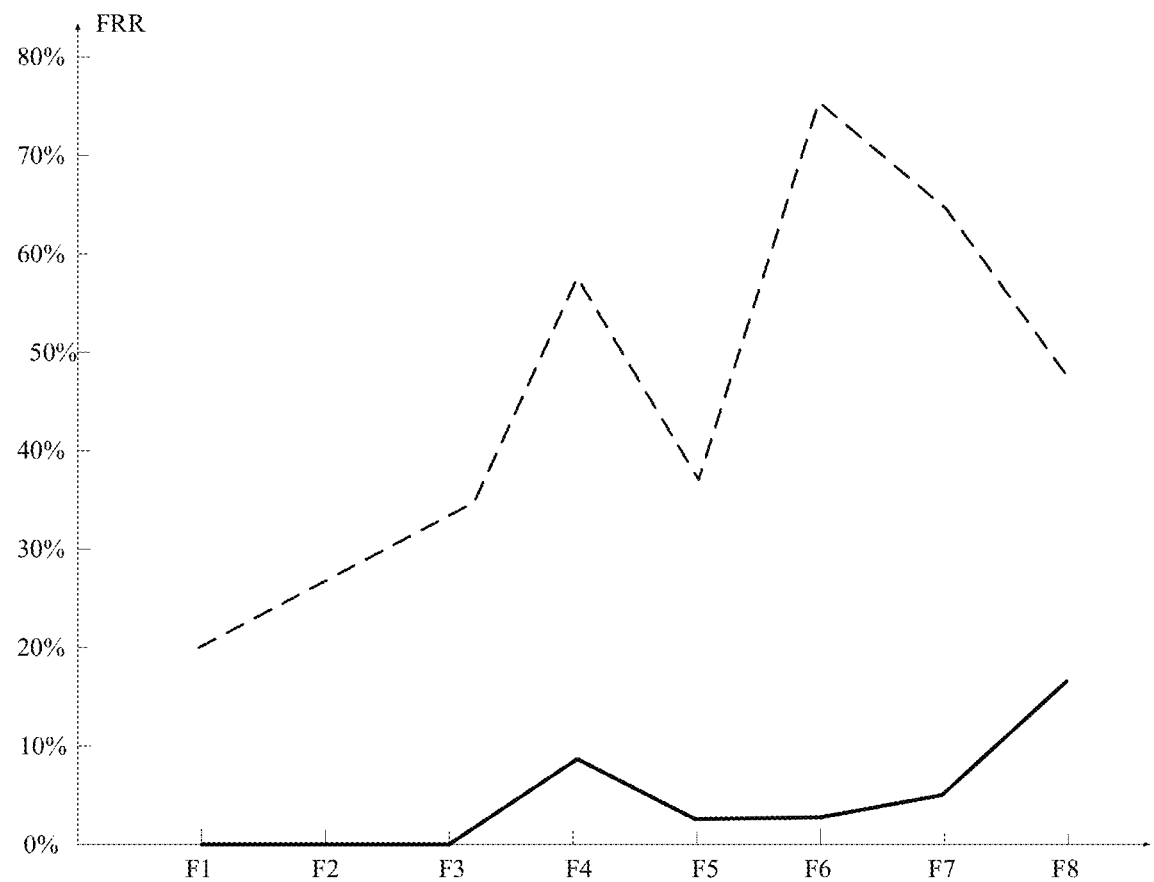
FIG. 13 is a comparison diagram obtained by using two fingerprint identification methods.

FIG. 13 shows a comparison diagram of false rejection rates (FRR) of fingerprint identification in two manners. The solid line in FIG. 13 is the FRR for fingerprint identification based on the method 400, that is, the solid line in FIG. 13 is the FRR obtained by adjusting some capturing parameters of capturing the fingerprint light signal based on the fingerprint identification environment and by performing fingerprint identification using the capturing parameters after the fingerprint identification environment is determined by using the colour filter layer. The dashed line in FIG. 13 is the FRR obtained by capturing the fingerprint light signal using a fixed capturing parameter to perform fingerprint identification instead of determining the fingerprint identification environment using the colour filter layer.

The abscissa in FIG. 13 represents different fingers. It can be seen that after two kinds of fingerprint identification apparatuses respectively perform fingerprint identification eight times, the maximum FRR shown by the solid line does not exceed 20%, the minimum FRR shown by the dashed line is 20%, and maximum FRR of the dashed line may be up to about 75%, and the FRR shown by the solid line is obviously lower than the FRR shown by the dashed line, which more effectively illustrates the high accuracy of fingerprint identification by the fingerprint identification method in the embodiment of the present application of the present application.

Figure 14:
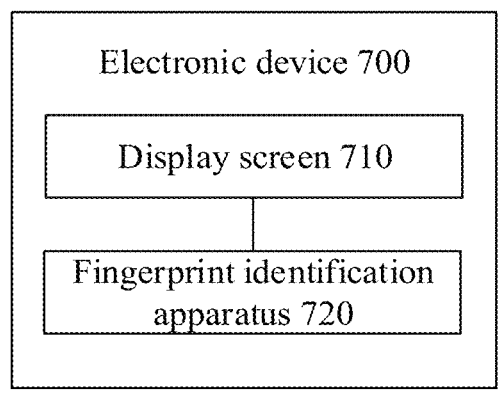
FIG. 14 is a schematic block diagram of an electronic device according to an embodiment of the present application.

An embodiment of the present application also provides an electronic device. As shown in FIG. 14, an electronic device 700 may include a display screen 710 and a fingerprint identification apparatus 720. The fingerprint identification apparatus 720 may be the fingerprint identification apparatus 300 in the foregoing embodiment, and is disposed under the display screen 710.

As an optional embodiment, the display screen 710 has a self-light-emitting display unit, which may be used as an excitation light source by the fingerprint identification apparatus 720 for fingerprint identification. In addition, the fingerprint identification apparatus 720 may be used to execute the content in the method embodiment shown in FIG. 10.

It should be understood that the display screen 710 may be an unfolded display screen or a foldable display screen, that is, a flexible display screen.

By way of example and not limitation, the electronic device in the embodiment of the present application may be portable or mobile computing devices such as a terminal device, a mobile phone, a tablet computer, a notebook computer, a desktop computer, a gaming device, an in-vehicle electronic device or a wearable smart device, and other electronic devices such as an electronic database, an automobile and an automated teller machine (ATM). The wearable intelligent devices include full-featured and large-sized devices that can implement complete or partial functions without depending on smartphones, such as smart watches or smart glasses, and devices that focus on only one type of application function and need to work with other devices such as smartphones, such as various smart bands or smart jewelry for monitoring physical signs.

It should be noted that, in a case of no conflict, the various embodiments and/or the technical features in the various embodiments described in the present application may be combined with each other arbitrarily, and the technical solutions obtained after the combination should also fall within the protection scope of the present application.

It should be understood that terms used in embodiments of the present application and the claims appended hereto are merely for the purpose of describing particular embodiments, and are not intended to limit the embodiments of the present application. For example, the use of a singular form of "a", "the" and "said" in the embodiment of the present application and the claims appended hereto are also intended to include a plural form, unless otherwise clearly indicated herein by context.

A person of ordinary skill in the art may be aware that the units in the examples described with reference to the embodiments disclosed in this specification may be implemented by electronic hardware, computer software, or a combination thereof. To clearly describe the interchangeability between the hardware and the software, the foregoing has generally described compositions and steps of each example based on functions. Whether these functions are performed by hardware or software depends on particular applications and designed constraint conditions of the technical solutions. A person skilled in the art may use different methods to implement the described functions for each particular application, but it should not be considered that the implementation goes beyond the scope of the present application.

In the several embodiments provided in the present application, it should be understood that, the disclosed system and apparatus may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual coupling or direct coupling or communication connection may be indirect coupling or communication connection through some interfaces, apparatuses or units, and may also be electrical, mechanical, or connection in other forms.

The units described as separate parts may be or may not be separated physically, and a component displayed as a unit may be or may not be a physical unit, namely, may be located in one place, or may be distributed on a plurality of network units. Part of or all of the units here may be selected according to a practical need to achieve the objectives of the solutions of the embodiments of the present application.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

If being implemented in the form of a software functional unit and sold or used as a separate product, the integrated unit may be stored in a computer-readable storage medium. Based on such understanding, the nature of the technical solutions of the present application, or the part contributing to the prior art, or all of or part of the technical solutions may be implemented in a form of software product. The computer software product is stored in a storage medium and includes several instructions for instructing a computer device (which may be a personal computer, a server, or a network device, and the like) to execute all of or part of the steps of the method described in the embodiments of the present application. The foregoing storage medium includes: various media that may store program codes, such as a U-disk, a removable hard disk, a read-only memory (ROM), a random access memory (RAM), a magnetic disk, a compact disk, and so on.

The foregoing descriptions are merely specific implementations of the present disclosure. The protection scope of the present application, however, is not limited thereto. Various equivalent modifications or replacements may be readily conceivable to any person skilled in the art within the technical scope disclosed in the present application, and such modifications or replacements shall fall within the protection scope of the present application. Therefore, the protection scope of the present application shall be subject to the protection scope of the claims.

What is claimed is:

1. A fingerprint identification method, wherein the method is applied to a fingerprint identification apparatus disposed under a display screen of an electronic device, the fingerprint identification apparatus comprises a pixel array and a colour filter layer, the colour filter layer comprises at least one filter unit, and the at least one filter unit is disposed above at least one first type pixel of the pixel array, respectively, and the method comprises:
   capturing a first light signal transmitting through the at least one filter unit and sensed by the first type pixel;
   determining a fingerprint identification environment according to an intensity of the first light signal; and
   determining, based on the fingerprint identification environment, a target capturing parameter of capturing a fingerprint light signal returned by reflection or scattering of a finger above the display screen, the fingerprint light signal being used for fingerprint identification;
   wherein the at least one filter unit comprises at least one red filter unit, the red filter unit is configured to transmit through a red light signal, and the first light signal comprises the red light signal; and
   the determining the fingerprint identification environment according to the intensity of the first light signal comprises:
   determining that the fingerprint identification environment is a strong light environment when an intensity of the red light signal is greater than a preset red light signal intensity; or
   determining that the fingerprint identification environment is a normal environment when an intensity of the red light signal is less than or equal to a preset red light signal intensity.

2. The method according to claim 1, wherein the at least one filter unit further comprises at least one blue filter unit, the blue light signal is configured to transmit through a blue light signal, and the first light signal further comprises the blue light signal; and
   the determining the fingerprint identification environment according to the intensity of the first light signal comprises:

determining that the fingerprint identification environment is a specific environment when an intensity of the red light signal is less than or equal to a preset red light signal intensity and an intensity of the blue light signal is greater than a preset blue light signal intensity.

3. The method according to claim 1, wherein the determining, based on the fingerprint identification environment, the target capturing parameter of capturing the fingerprint light signal returned by reflection or scattering of the finger above the display screen comprises:
determining an adjustment amount of a preset capturing parameter according to a variation of ambient light of the fingerprint identification environment relative to preset ambient light, wherein under the preset ambient light, a capturing parameter of capturing the fingerprint light signal is the preset capturing parameter; and
determining the target capturing parameter according to the preset capturing parameter and the adjustment amount.

4. The method according to claim 3, wherein the target capturing parameter comprises a target exposure time and a target gain parameter, and the preset capturing parameter comprises a preset exposure time and a preset gain parameter;
if the fingerprint identification environment is a strong light environment, a target product is a difference between a preset product and the adjustment amount, wherein the target product is a product of the target exposure time and the target gain parameter, and the preset product is a product of the preset exposure time and the preset gain parameter, the preset exposure time is increased to the target exposure time and the preset gain parameter is decreased to the target gain parameter, or the target exposure time is the preset exposure time and the preset gain parameter is decreased to the target gain parameter, or the preset exposure time is decreased to the target exposure time and the preset gain parameter is decreased to the target gain parameter;
if the fingerprint identification environment is a normal environment, the adjustment amount is zero and the target product is the preset product, wherein the target exposure time is the preset exposure time, and the target gain parameter is the preset gain parameter; and
if the fingerprint identification environment is a specific environment, the target product is a sum of the preset product and the adjustment amount, wherein the preset exposure time is increased to the target exposure time and the preset gain parameter is increased to the target gain parameter, or the target exposure time is the preset exposure time and the preset gain parameter is increased to the target gain parameter, or the preset exposure time is decreased to the target exposure time, and the preset gain parameter is increased to the target gain parameter.

5. The method according to claim 1, wherein the at least one filter unit is uniformly or non-uniformly distributed on the colour filter layer, and when the at least one filter unit is uniformly distributed on the colour filter layer, the at least one filter unit is arranged on the colour filter layer at an interval.

6. The method according to claim 1, wherein the at least one filter unit is distributed in an edge region of the colour filter layer.

7. The method according to claim 6, wherein the at least one filter unit is discretely distributed in the edge region of the colour filter layer.

8. A fingerprint identification apparatus, wherein the fingerprint identification apparatus is disposed under a display screen of an electronic device for under-screen fingerprint identification, and the fingerprint identification apparatus comprises:
a pixel array configured to capture a fingerprint light signal returned by reflection or scattering of a finger above the display screen, the fingerprint light signal being used for fingerprint identification; and
a colour filter layer comprising at least one filter unit, the at least one filter unit being disposed above at least one first type pixel of the pixel array, respectively;
wherein the at least one first type pixel is configured to sense a first light signal transmitting through the at least one filter unit, and an intensity of the first light signal is used for determining a fingerprint identification environment to obtain a target capturing parameter of capturing the fingerprint light signal;
wherein the fingerprint identification apparatus further comprises a processor, and the processor is configured to:
determine the fingerprint identification environment based on the intensity of the first light signal; and
determine the target capturing parameter based on the fingerprint identification environment;
wherein the at least one filter unit comprises at least one red filter unit, the red filter unit is configured to transmit through a red light signal, and the first light signal comprises the red light signal; and
the processor is configured to:
determine that the fingerprint identification environment is a strong light environment when an intensity of the red light signal is greater than a preset red light signal intensity; or
determine that the fingerprint identification environment is a normal environment when an intensity of the red light signal is less than or equal to a preset red light signal intensity.

9. The fingerprint identification apparatus according to claim 8, wherein the at least one filter unit further comprises at least one blue filter unit, the blue light signal is configured to transmit through a blue light signal, and the first light signal further comprises the blue light signal; and
the processor is configured to:
determine that the fingerprint identification environment is a specific environment when an intensity of the red light signal is less than or equal to a preset red light signal intensity and an intensity of the blue light signal is greater than a preset blue light signal intensity.

10. The fingerprint identification apparatus according to claim 8, wherein the processor is configured to:
determine an adjustment amount of a preset capturing parameter according to a variation of ambient light of the fingerprint identification environment relative to preset ambient light, wherein under the preset ambient light, a capturing parameter of capturing the fingerprint light signal is the preset capturing parameter; and
determine the target capturing parameter according to the preset capturing parameter and the adjustment amount.

11. The fingerprint identification apparatus according to claim 10, wherein the target capturing parameter comprises a target exposure time and a target gain parameter, and the preset capturing parameter comprises a preset exposure time and a preset gain parameter;
if the fingerprint identification environment is a strong light environment, a target product is a difference between a preset product and the adjustment amount, wherein the target product is a product of the target exposure time and the target gain parameter, and the preset product is a product of the preset exposure time and the preset gain parameter, the processor is configured to increase the preset exposure time to the target exposure time and decrease the preset gain parameter to the target gain parameter, or not adjust the preset exposure time and decrease the preset gain parameter to the target gain parameter, or decrease the preset exposure time to the target exposure time and decrease the preset gain parameter to the target gain parameter;

if the fingerprint identification environment is a normal environment, the adjustment amount is zero and the target product is the preset product, wherein the processor does not adjust the preset exposure time and the preset gain parameter; and if the fingerprint identification environment is a specific environment, the target product is a sum of the preset product and the adjustment amount, wherein the processor is configured to increase the preset exposure time to the target exposure time and increase the preset gain parameter to the target gain parameter, or not adjust the preset exposure time and increase the preset gain parameter to the target gain parameter, or decrease the preset exposure time to the target exposure time and increase the preset gain parameter to the target gain parameter.

12. The fingerprint identification apparatus according claim 8, wherein the at least one filter unit is uniformly or non-uniformly distributed on the colour filter layer, and when the at least one filter unit is uniformly distributed on the colour filter layer, the at least one filter unit is arranged on the colour filter layer at an interval.

13. The fingerprint identification apparatus according to claim 8, wherein the at least one filter unit is distributed in an edge region of the colour filter layer.

14. The fingerprint identification apparatus according to claim 13, wherein the at least one filter unit is discretely distributed in the edge region of the colour filter layer.

15. The fingerprint identification apparatus according to claim 8, wherein the fingerprint identification apparatus further comprises at least one light shielding layer and a micro-lens array, the at least one light shielding layer is located under the micro-lens array and is provided with a plurality of light passing apertures, and the pixel array is configured to receive a light signal converged to the plurality of light passing apertures via the micro-lens array and passing through the plurality of light passing apertures;

wherein the colour filter layer is disposed between the at least one light shielding layer and the micro-lens array.

16. An electronic device comprising:

a display screen; and a fingerprint identification apparatus, wherein the fingerprint identification apparatus is disposed under the display screen for under-screen fingerprint identification, and the fingerprint identification apparatus comprises:

a pixel array configured to capture a fingerprint light signal returned by reflection or scattering of a finger above the display screen, the fingerprint light signal being used for fingerprint identification; and a colour filter layer comprising at least one filter unit, the at least one filter unit being disposed above at least one first type pixel of the pixel array, respectively;

wherein the at least one first type pixel is configured to sense a first light signal transmitting through the at least one filter unit, and an intensity of the first light signal is used for determining a fingerprint identification environment to obtain a target capturing parameter of capturing the fingerprint light signal;

wherein the fingerprint identification apparatus further comprises a processor, and the processor is configured to:

determine the fingerprint identification environment based on the intensity of the first light signal; and determine the target capturing parameter based on the fingerprint identification environment;

wherein the at least one filter unit comprises at least one red filter unit, the red filter unit is configured to transmit through a red light signal, and the first light signal comprises the red light signal; and the processor is configured to:

determine that the fingerprint identification environment is a strong light environment when an intensity of the red light signal is greater than a preset red light signal intensity; or determine that the fingerprint identification environment is a normal environment when an intensity of the red light signal is less than or equal to a preset red light signal intensity.

* * * * *